United States Patent [19]
Kanno et al.

[11] Patent Number: 5,408,113
[45] Date of Patent: Apr. 18, 1995

[54] HIGH SENSITIVITY IMPROVED PHOTOELECTRIC IMAGING DEVICE WITH A HIGH SIGNAL TO NOISE RATIO

[75] Inventors: Tohru Kanno; Yasuyuki Shindoh; Noriyuki Terao; Takeshi Nanjo; Atsuhiro Ohizumi; Yutaka Maita, all of Natori, Japan

[73] Assignees: Ricoh Company, Ltd., Tokyo; Ricoh Research Institute of General Electronics Co., Ltd., Natori, both of Japan

[21] Appl. No.: 82,371

[22] Filed: Jun. 28, 1993

[30] Foreign Application Priority Data

| Jun. 30, 1992 | [JP] | Japan | 4-196024 |
| Jul. 9, 1992 | [JP] | Japan | 4-205983 |
| Jul. 22, 1992 | [JP] | Japan | 4-216462 |
| Aug. 24, 1992 | [JP] | Japan | 4-247348 |
| Jun. 10, 1993 | [JP] | Japan | 5-165131 |

[51] Int. Cl.⁶ ............................ H01L 27/14; H01L 31/00
[52] U.S. Cl. .................................. 257/292; 257/443; 257/448; 257/461; 250/206; 250/208.1; 250/215
[58] Field of Search ............... 257/290, 291, 292, 443, 257/448, 461; 250/552, 553, 206, 208.1, 215

[56] References Cited

FOREIGN PATENT DOCUMENTS

| 0177275 | 4/1986 | European Pat. Off. | 257/443 |
| 59-25280 | 2/1984 | Japan | 257/290 |
| 2194389 | 3/1988 | United Kingdom | 257/292 |

*Primary Examiner*—Ngan V. Ngo
*Attorney, Agent, or Firm*—Oblon, Spivak, McClelland, Maier & Neustadt

[57] ABSTRACT

A photoelectric transfer device includes at least one photoelectric transfer cell having the following elements: A photoelectric transfer element generates a photoelectric current based on a quantity of incident light. An amplifier element includes first FET and functions as a source follower in which a source voltage of the first FET is varied so as to follow up a gate voltage thereof. A read unit outputs, as an output signal, the source voltage of the source follower. The photoelectric transfer element is connected to a gate and source of the amplifier element so that a voltage between the gate and source of the amplifier element is applied across the photoelectric transfer element.

48 Claims, 29 Drawing Sheets

FIG.27
FIG.28
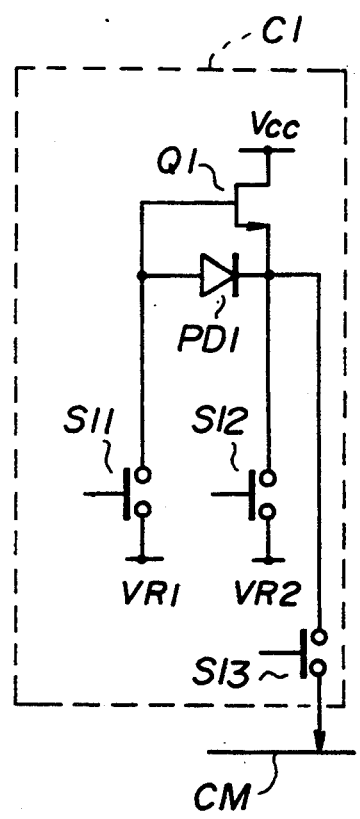
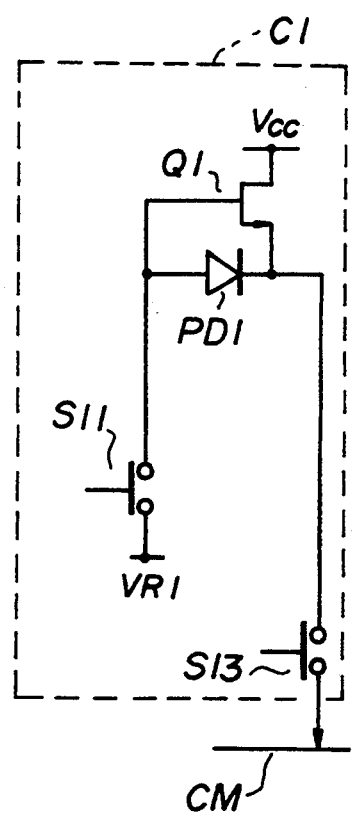

HIGH SENSITIVITY IMPROVED PHOTOELECTRIC IMAGING DEVICE WITH A HIGH SIGNAL TO NOISE RATIO

BACKGROUND OF THE INVENTION

1. Field of the Invention

The present invention generally relates to photoelectric transfer or transducer devices utilized in an image inputting device such as a digital (color) copying machine, an image data inputting device such as a desk top publishing system, a reading device for original documents such as a facsimile machine, or an image pickup device such as a VDT (Visual Display Terminal).

2. Description of the Prior Art

A photoelectric transfer device is known in which a depletion type N-channel MOS field effect transistor (MOSFET) is used as an amplifier element. Generally, such a photoelectric transfer device uses a plurality of photoelectric transfer elements arranged in a line or in rows and columns and which outputs electric signals based on the quantities of incident light in a time sequence.

FIG. 1 shows a conventional photoelectric transfer device as described above. The conventional photoelectric transfer device includes a plurality of (n: an integer) photoelectric transfer elements arranged in a line or in rows and columns, and a plurality of (n) photoelectric transfer cells associated with the n photoelectric transfer elements. Since the n photoelectric transfer cells have the same structures as each other, only one photoelectric transfer cell (corresponding to one bit) is illustrated for the sake of simplicity.

The photoelectric transfer cell shown in FIG. 1 is made up of a photoelectric transfer element PD formed with a photodiode, an amplifier element Q formed with a depletion type N-Channel MOSFET, a first initializing means (a switch element) S1, a second initializing means (a switch element) S2 and a read means (a switch element) S3. The first initializing means S1 performs a first initializing operation in which the gate of the amplifier element Q is set to a potential VR1. The second initializing means S2 performs a second initializing operation in which the source of the amplifier element Q is set to a potential VR2. The read means S3 outputs, as an output signal from the photoelectric transfer cell, the source potential of the amplifier element Q to a common signal line CM. One terminal of the photoelectric transfer element PD is connected to the first initializing means S1 and the gate of the amplifier element Q, and the other terminal of the element PD is maintained at a voltage Vcc applied to the drain of the amplifier element Q. The output signal output to the common signal line CM is amplified by an amplifier AMP of the final stage, which outputs an amplified output signal as the final output signal.

At the commencement of the operation of the photoelectric transfer device shown in FIG. 1, the first initializing means S1 and the second initializing means S2 are switched to the closed state, and hence the gate and source of the amplifier element Q are set to the potentials VR1 and VR2, respectively. After the initializing operation of the first and second initializing means S1 and S2 is completed, the source potential of the amplifier element Q is settled at a potential which is higher than the gate potential thereof by a gate-source voltage Vth thereof. In this state, when a photoelectric current dependent on the quantity of incident light flows in the photoelectric transfer element PD, the photoelectric current charges a parasitic capacitor of the first initializing means S1, a parasitic capacitor of the second initializing means S2, and a parasitic capacitor of the photoelectric transfer element PD. That is, a capacitor (storage capacitor) coupled to the gate of the amplifier element Q is charged. When charging of the capacitor (storage capacitor) connected to the gate of the amplifier element Q is completed, the gate potential of the amplifier element Q is raised. A source current (drain current) dependent on the above increase in the gate potential flows in the amplifier element Q. This source current charges a stray capacitor and the parasitic capacitor of the second initializing means S2, so that the source potential of the amplifier element Q is raised as much as the increased gate potential. That is, the amplifier element Q functions as a source follower, and the source potential of the amplifier element Q changes so as to follow up to the gate potential. The gate potential depends on the magnitude of the photoelectric current, and hence the source potential reflects the magnitude of the photoelectric current. Thus, the source potential can be read as the result of the photoelectric transferring operation of one photoelectric transfer cell, that is, as the output signal.

Factors determining the sensitivity of the above-mentioned photoelectric transfer device are the sensitivity (the ratio of the photoelectric current to the amount of the incident light) of the photoelectric transfer element PD, and the capacitor (storage capacitor) coupled to the gate of the amplifier element Q. In order to enhance the sensitivity, it is necessary to improve the sensitivity of the photoelectric transfer element PD or decrease the storage capacitance. More concretely, normally, the quantum efficiency of the photoelectric transfer element PD is as high as 90% or higher, and the photoelectric current is approximately based on the dimensions of the photoelectric transfer element PD. Hence, in order to improve sensitivity, it is necessary to decrease the storage capacitance if the size of the photoelectric transfer element PD is not to be diminished.

However, in the photoelectric transfer device shown in FIG. 1, most of the storage capacitance is the parasitic capacitance of the photoelectric transfer element PD. When attempting to improve the sensitivity of the photoelectric transfer element PD, the parasitic capacitance of the photoelectric transfer element PD is increased and hence the storage capacitance is increased. That is, increasing of the sensitivity of the photoelectric transfer element PD is inconsistent with decreasing of the storage capacitance. For the above reason, it is very difficult to increase the sensitivity of the whole device. More particularly, except for CCDs (Charge-Coupled Device), the conventional photoelectric transfer elements PD have large parasitic capacitances, which functions as a storage capacitance. Hence, it is very difficult to reduce the storage capacitance. Further, the CCDs have a large capacitance of a part which converts a charge into a voltage, and do not have high sensitivities. Taking into account the above matter, the structure shown in FIG. 1 is provided with the final-stage amplifier AMP. However, the signal from the amplifier element Q is very small and penetrates through a distance of approximately 10 mm until it reaches the amplifier AMP. Thus, the signal from the amplifier element Q is liable to be affected by either external noise or both or transmission noise. Further, the amplifier AMP introduces noise which cannot be ignored. Even if improvement in sensitivity is attempted by means of the amplifier AMP, it is very difficult to obtain a high S/N ratio.

Furthermore, the photoelectric transfer device of the amplifying type uses a large number of elements within one photoelectric transfer cell. Hence, in an integrated circuit device, in which the elements are integrated on a chip, there is not a high integration density if specific considerations for the layout of the elements is not taken. This prevents application to a sensor using a reduced optical system.

SUMMARY OF THE INVENTION

It is a general object of the present invention to provide a photoelectric transfer element in which the above disadvantages are eliminated.

A more specific object of the present invention is to provide a high-sensitivity, high-S/N ratio photoelectric transfer element suitable for integration.

The above objects of the present invention are achieved by a photoelectric transfer device comprising: at least one photoelectric transfer cell; the photoelectric transfer cell comprising: a photoelectric transfer element generating a photoelectric current based on an quantity of incident light; an amplifier element including first FET and functioning as a source follower in which a source voltage of the first FET is varied so as to follow up a gate voltage thereof; and read means, coupled to the amplifier element, for outputting, as an output signal, the source voltage of the source follower, the photoelectric transfer element being connected to a gate and source of the amplifier element so that a voltage between the gate and source of the amplifier element is applied across the photoelectric transfer element.

The above objects of the present invention are also achieved by a photoelectric transfer device comprising a plurality of photoelectric transfer cells connected in parallel, each of the photoelectric transfer cells being configured as mentioned above.

BRIEF DESCRIPTION OF THE DRAWINGS

Other objects, features and advantages of the present invention will become more apparent from the following detailed description when read in conjunction with the accompanying drawings, in which:

FIG. 27 is a circuit diagram of yet another variation of the photoelectric transfer cell used in the present invention;

FIG. 28 is a circuit diagram of still another variation of the photoelectric transfer cell used in the present invention;

DESCRIPTION OF THE PREFERRED EMBODIMENTS

A description will now be given, with reference to FIG. 2, of a photoelectric transfer device according to a first embodiment of the present invention. The device shown in FIG. 2 comprises n photoelectric transfer elements PD1-PDn arranged in 10 a line or in rows and columns. Further, the device comprises n photoelectric transfer cells C1-Cn respectively associated with the photoelectric transfer elements PD1-PDn. Each of the cells has an identical circuit configuration. For example, the nth cell Cn is made up of the photoelectric transfer element PDn formed with a photodiode, an amplifier element formed with a depletion type N-channel MOSFET, a first initializing means (more concretely, a switch element) Sn1, a second initializing means (more concretely, a switch element) Sn2, and a read means (more concretely, a switch element) Sn3. The first initializing means Sn1 performs the aforementioned first initializing operation in which the gate of the amplifier element Qn is set to the potential VR1. The second initializing means Sn2 performs the aforementioned second initializing operation in which the source of the amplifier element Qn is set to the potential VR2. The read means Sn3 outputs, as an output signal from the photoelectric transfer cell Qn, the source potential of the amplifier element Qn to the common signal line CM.

Figure 1:
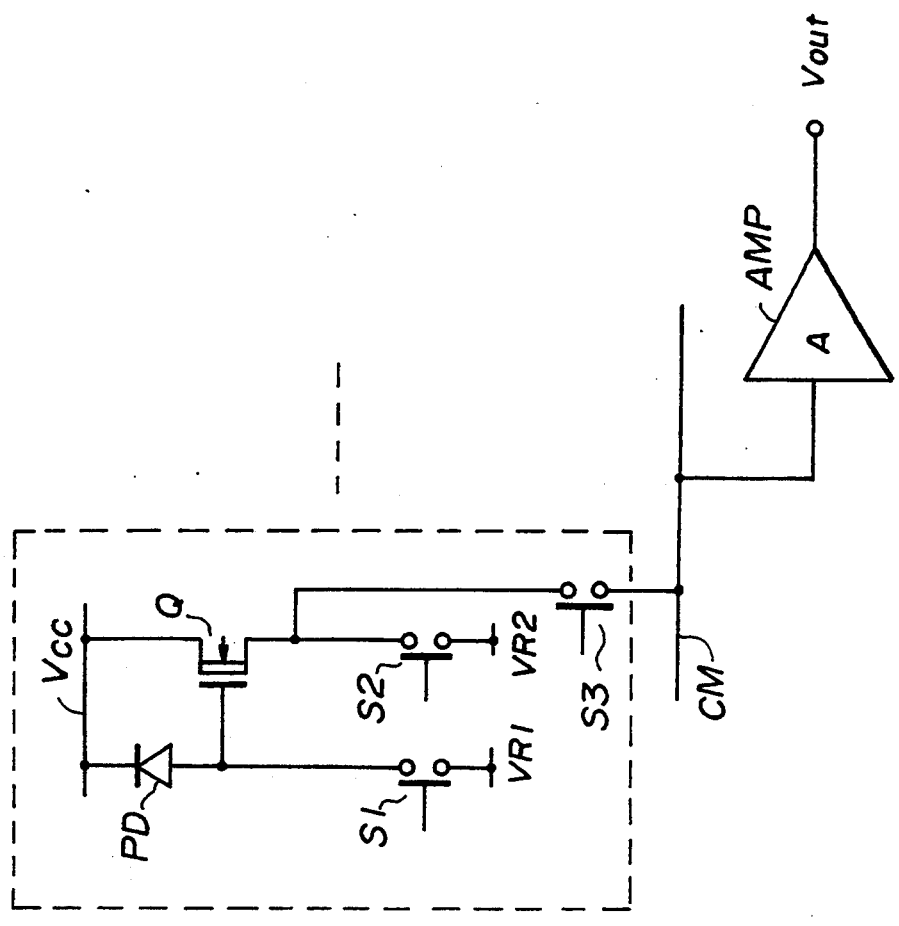
FIG. 1 is a block diagram of a conventional photoelectric transfer device.
Figure 2:
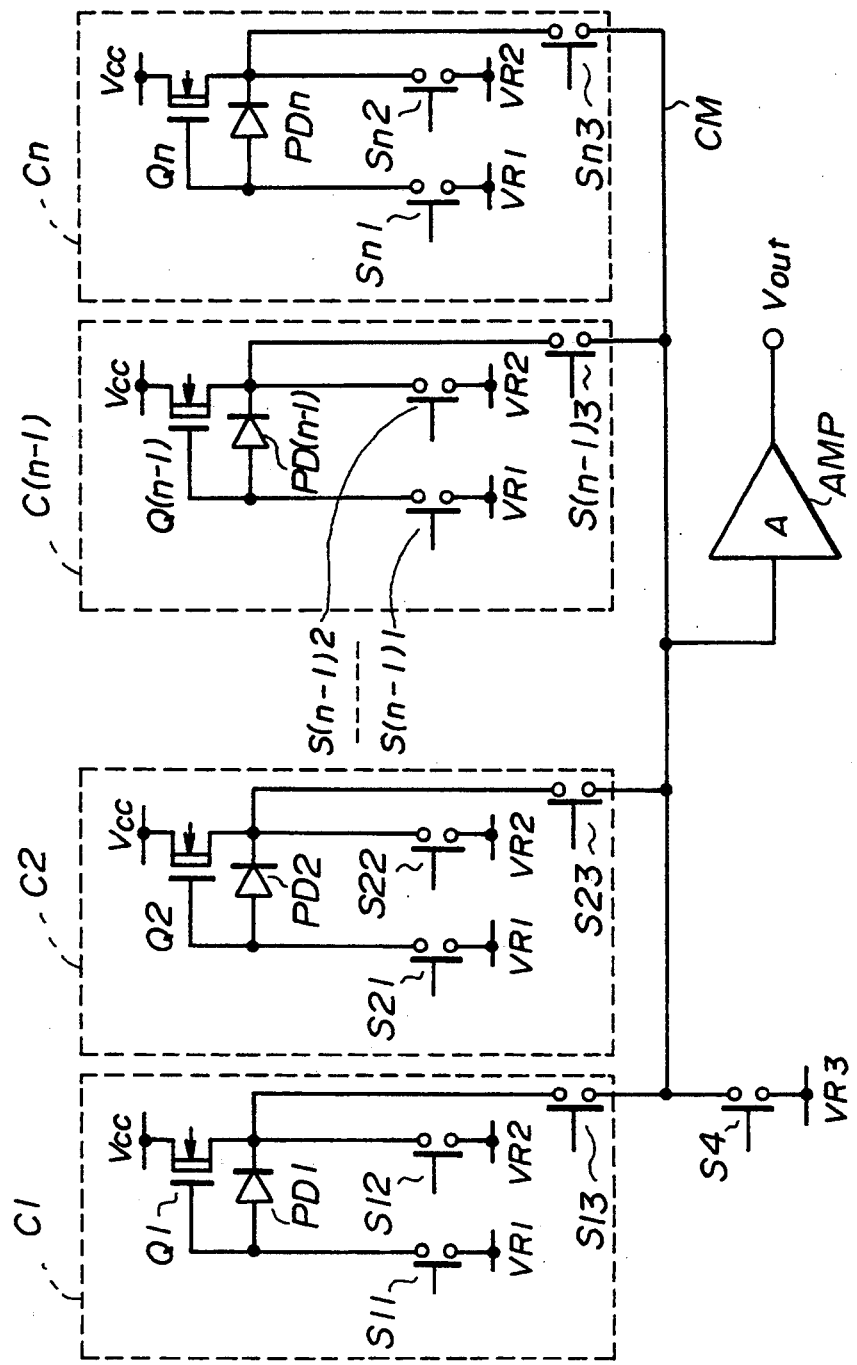
FIG. 2 is a circuit diagram of a photoelectric transfer device according to a first embodiment of the present invention.

It is to be noted that the circuit configuration shown in FIG. 2 differs from that shown in FIG. 1 in that the photoelectric transfer element PDn shown in FIG. 2 is connected between the gate and source of the amplifier element. More specifically, one terminal of the photoelectric transfer element PDn is connected to the first initializing means Sn1 and the gate of the amplifier element Qn, and the other terminal thereof is connected to the second initializing means Sn2, the read means Sn3 and the source of the amplifier element Qn. The drain of the amplifier element Qn is maintained at the voltage Vcc. Further, a third initializing means (more concretely, a switch element) S4, and the amplifier AMP are connected to the common signal line CM. The third initializing means S4 performs a third initializing operation in which the potential of the common signal line CM is set to a potential VR3. The amplifier AMP performs an impedance transfer and amplifies the potential of the common signal line CM so that it is multiplexed by a factor A, and outputs the final output signal Vout.

Figure 3:
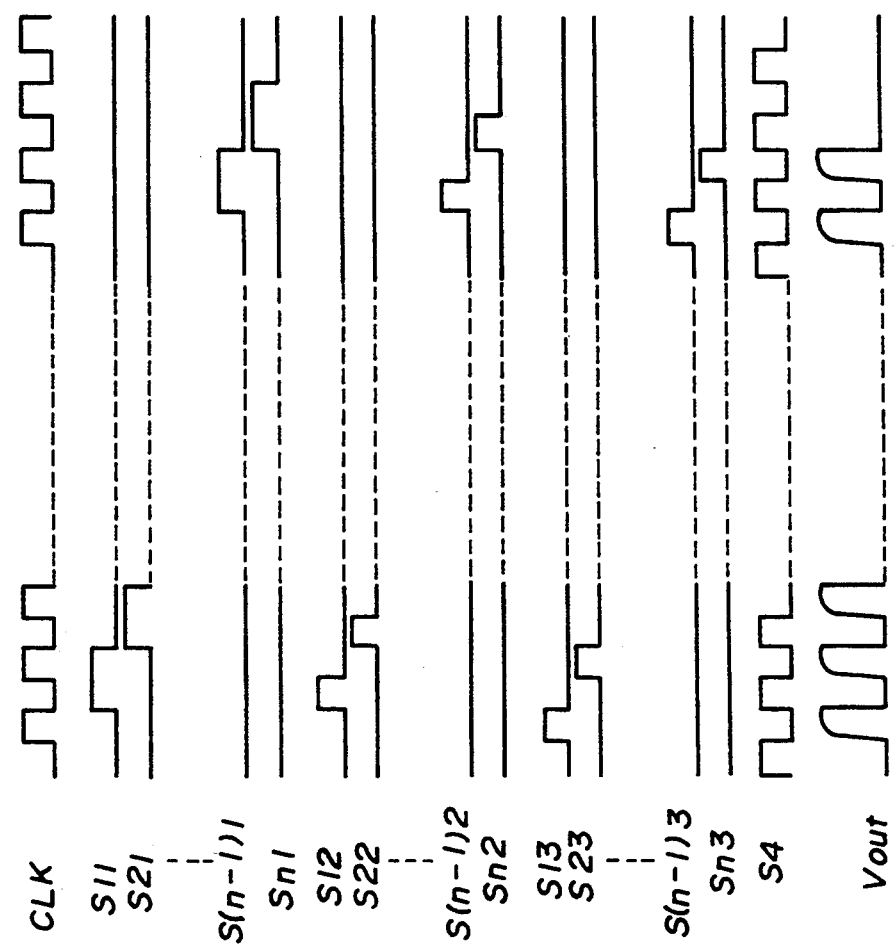
FIG. 3 is a time chart showing the operation of the photoelectric transfer device shown in FIG. 2.

A description will now be given, with reference to FIG. 3, of the operation of the photoelectric transfer element shown in FIG. 2. It will now be assumed that the photoelectric transfer element shown in FIG. 2 operates in synchronism with a clock signal CLK (not shown in FIG. 2) having a predetermined period. The n photoelectric transfer cells C1–Cn are sequentially initialized one by one every cycle in such a manner that the first cell C1 is initialized within one period of the clock signal CLK and the second cell C2 is initialized within the next period thereof. When the initializing operation on a cell is completed, the photoelectric transfer process of the above cell is initiated.

By way of example, the operation of the first photoelectric transfer cell C1 will now be described. The switches S11 and S12 are turned ON in order to set the gate and source of the amplifier element Q1 to the potentials VR1 and VR2, respectively. In this manner, the cell C1 is initialized. Next, the switch S12 is turned OFF, and thereby a parasitic capacitor of the switch S12 and a stray capacitor of the source are charged. Then, the source of the amplifier element Q1 becomes equal to (VR1+Vth). That is, the source is settled at a potential higher than the gate potential by the gate-source voltage Vth. Thereafter, the switch S11 is turned OFF, and a photoelectric current flows in a quantity depending on the amount of the incident light. Hence, a capacitor (storage capacitor) connected to the gate of the amplifier element Q1 is charged by the photoelectric current.

In the above manner, a charge depending on the photoelectric current is stored in the storage capacitor connected to the amplifier element Q1. Hence, the gate potential of the amplifier element Q1 is raised, and at the same time, the source potential is also raised by an increase in the gate potential while the parasitic capacitor of the switch S12 and the capacitor of the source are charged. In this manner, the amplifier element Q1 functions as a source follower in which the source voltage changes so as to follow up the gate voltage, and the gate-source voltage of the amplifier element Q1 holds the constant voltage Vth.

In the configuration shown in FIG. 2, the photoelectric transfer element PD1 is connected between the gate and source of the amplifier element Q1. Hence, the gate-source voltage of the amplifier element Q1 functions as the source follower, that is, the constant voltage Vth is applied to the photoelectric transfer element Q1. Hence, the charge stored in the parasitic capacitor of the photoelectric transfer element PD1 is always approximately constant and is little varied. As a result, it becomes possible to greatly reduce the influence of the parasitic capacitance of the photoelectric transfer element PD1 on the storage capacitance. This is equivalent to a situation where the parasitic capacitance of the element PD1 is substantially subtracted from the storage capacitance, and hence the storage capacitance is substantially reduced. For the same reason as mentioned above, it becomes possible to prevent the storage capacitance from being affected by the gate-source capacitance of the amplifier element Q1. Hence, it is possible to maintain the storage capacitance at a small value even if the size of the photoelectric transfer element PD1 is increased and the parasitic capacitance thereof is increased in order to improve the sensitivity thereof. As a result, the whole sensitivity of the device can be greatly improved.

The photoelectric transfer cell C1 is initialized again when a predetermined read time (storage time) elapses. The switch S13 is turned ON in the half cycle of the clock signal CLK immediately prior to the above initialization, and the source potential immediately prior to the initialization is output, as the output signal, to the common signal line CM and is then amplified by the amplifier AMP. The output signal of the amplifier AMP is the final output signal Vout corresponding to the result of the photoelectric transfer of the photoelectric transfer cell C1. Thereafter, the switch S13 is turned OFF and the switch S4 is turned ON in the next half cycle of the clock signal CLK. Thus, the potential of the common signal line CM is initialized to the potential VR3, and at the same time the switches S11 and S12 are turned ON, so that the amplifier element Q1 can be initialized. The second through nth photoelectric transfer cells C2–Cn sequentially perform the same process as the first photoelectric transfer cell C1 with the predetermined period defined by the clock signal CLK.

The photoelectric transfer cells C1–Cn are designed so that the voltages applied thereto are constant, and hence the parasitic capacitances of the photoelectric transfer elements do not greatly affect the storage capacitances (more concretely, 1/(a few tens)–1/(100+a few tens)). As a result, it becomes possible to substantially reduce the storage capacitances (more concretely, equal to a few tens of pF) and obtain a high sensitivity (approximately equal to 20–30 V/lx/sec; approximately 10 times the conventional sensitivity). Because a high sensitivity can be obtained, the signals from the cells can be transferred at a high voltage, and are not greatly affected by external noise or noise of the final-stage amplifier AMP. As a result, the S/N ratio of the configuration shown in FIG. 2 can be improved (more concretely, the S/N ratio can be improved by approximately 6–10 dB).

Figure 4:
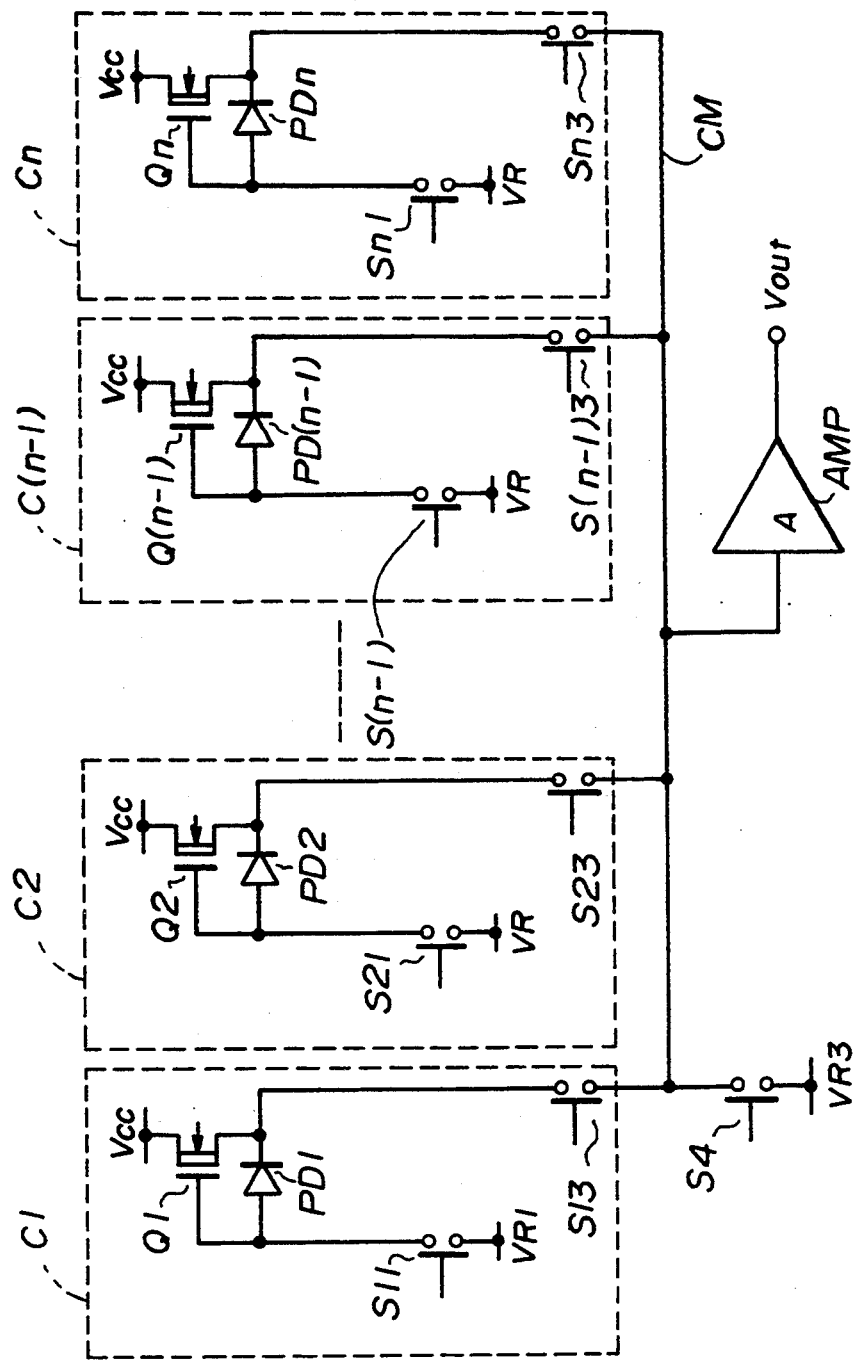
FIG. 4 is a circuit diagram of a photoelectric transfer device according to a second embodiment of the present invention.

FIG. 4 shows a photoelectric transfer element according to a second embodiment of the present invention. The second embodiment of the present invention differs from the first embodiment thereof in that the second initializing means Sn2 is omitted from the configuration of the first embodiment. In FIG. 4, the function of the second initializing means Sn2 is realized by operation timing control by the first; initializing means Sn1, the read means Sn3 and the third initializing means Sn4.

Figure 5:
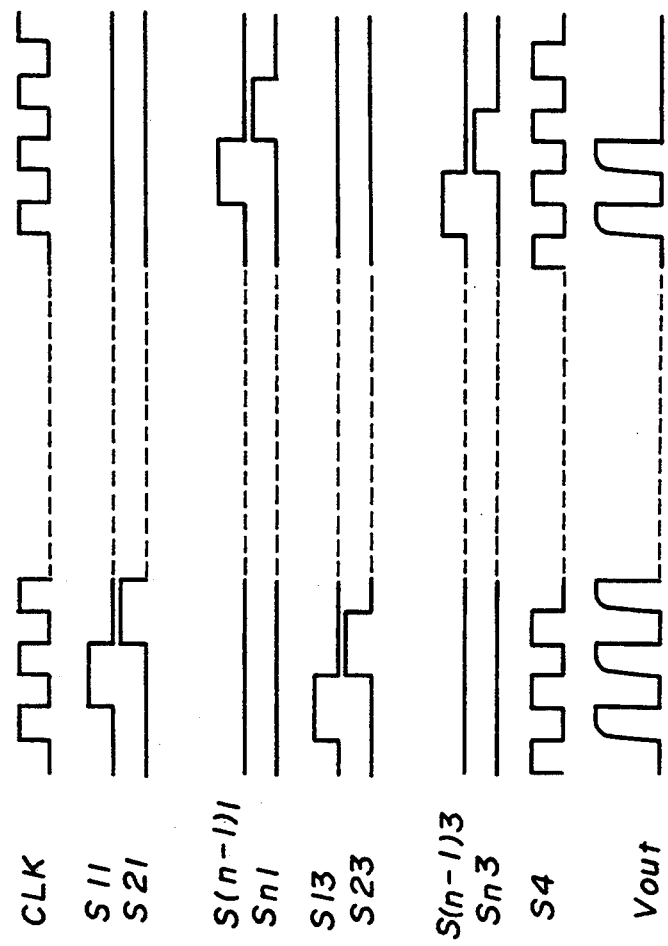
FIG. 5 is a time chart showing the operation of the photoelectric transfer device shown in FIG. 4.

FIG. 5 is a time chart showing the operation of the photoelectric transfer element shown in FIG. 4. Referring to FIG. 5, In the first photoelectric transfer cell C1 of interest, the switch S13 is maintained in the ON state during one period of the clock signal CLK as in the case of the switch S11. However, the switch S13 is turned ON (½) period prior to the switch S11. The reading of the output signal of the cell C1 is performed during the half period of the clocks signal CLK while only the switch S13 is held ON. Further, the switch S4 is held ON during the half period while the switches S11 and S13 are held ON. Hence, it is possible to simultaneously initialize the potential of the common signal line CM and the source potential of the amplifier element Q1.

According to the second embodiment, it is possible to realize by means of the operation timing control, the same photoelectric transfer process as that of the first embodiment without the second initializing means Sn2 and to reduce the size of the photoelectric transfer device.

The photoelectric transfer devices shown in FIGS. 2 and 4 can be integrated on a semiconductor substrate, typically using silicon. In this case, the amplifier element Qn can be formed with a depletion type N-channel MOSFET, and the first initializing means S11 and the read means S13 can be formed with respective N-channel MOSFETs.

Figure 6:
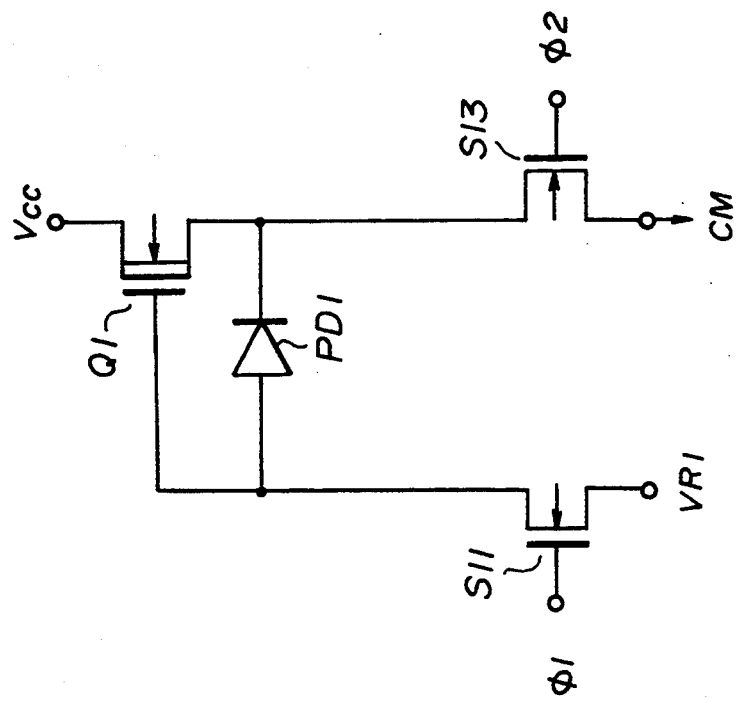
FIG. 6 is a circuit diagram of a photoelectric transfer cell used in the present invention.

FIG. 6 shows a circuit configuration in which N-channel MOSFETs are respectively used as the first initializing means S11 and the read means S13 of the first photoelectric transfer cell C1 shown in FIG. 4.

Figure 7:
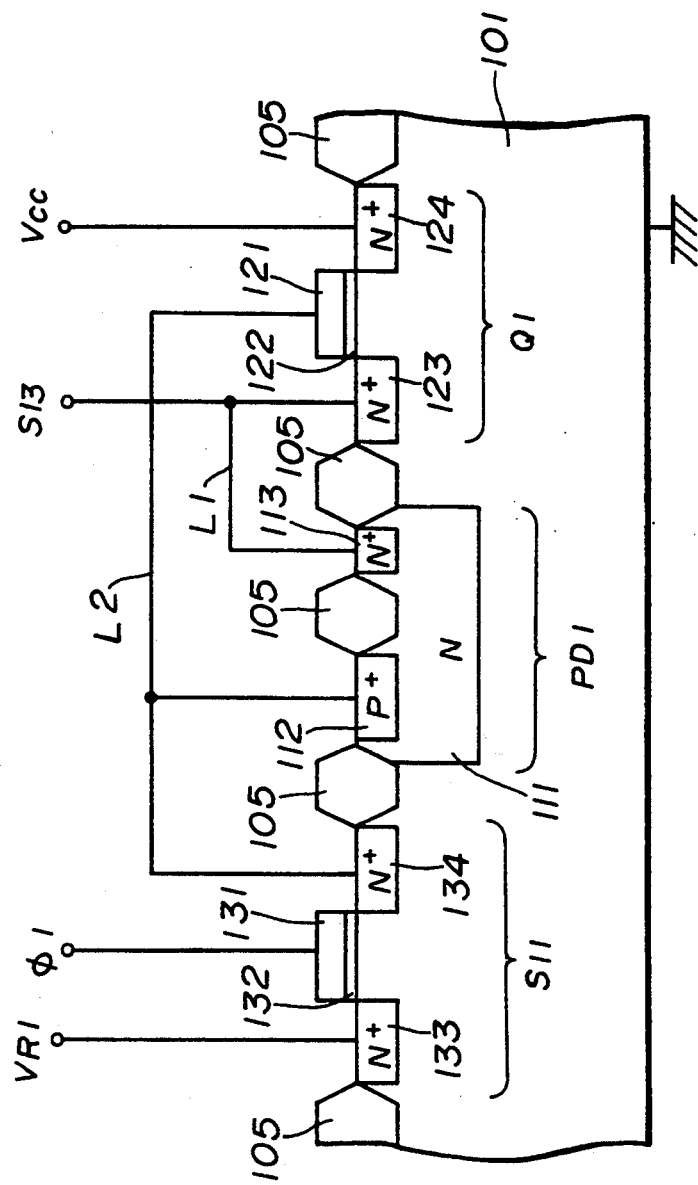
FIG. 7 is a cross-sectional view of a layer structure of the photoelectric transfer cell shown in FIG. 6.

The photoelectric transfer cell C1 shown in FIG. 6 can be formed in a silicon substrate, as shown in FIG. 7. Referring to FIG. 7, an N-type well 111 is formed in a P-type silicon substrate 101. A high-density P-type region 112 is formed in the N-type well 111. The N-type well 111 and the high-density P-type region 112 form a P+-type photodiode serving as the photoelectric transfer element PD1. Further, in the P-type silicon substrate 101 are formed a source 123 and a drain 124 of the depletion-type N-channel MOSFET functioning as the amplifier element Q1, and a source 133 and a drain 134 of the N-channel MOSFET functioning as the first initializing means S11. Furthermore, on the P-type silicon substrate 101 are formed a gate electrode 121 of the amplifier element Q1 and a gate electrode 131 of the first initializing means S11 through gate insulating films 122 and 132. In the N-type well 111 is formed a high-density N-type region (N+-type region) 113 used to make contact with an N-type side electrode of the photoelectric transfer element PD1 (electrode of the N-type well). The elements, that is, the photoelectric transfer element PD1 and the first initializing means S11 of the amplifier element Q1 are isolated from each other by field insulating films 105. The N-type well 111 of the photoelectric transfer element PD1 is connected to the source 123 of the amplifier element Q1 by means of an electrode line L1. The high-density P-type region 112 of the photoelectric transfer element PD1 is connected, by means of an electrode line L2, to the gate electrode 121 of the amplifier element Q1 and the drain 134 of the first initializing means S11. The structure of the read means S13 is omitted in FIG. 7.

The inventors of the present invention actually made the layer structure shown in FIG. 7 by the following process. First of all, The N-type well 111 is formed in the P-type silicon substrate 101 having a resistivity of 10 Ωcm. More particularly, using a resist pattern as a mask, phosphorus ions are implanted in the surface portion of the P-type silicon substrate 101 at a dose of 2.0E12 atoms/cm$^2$ and 150 keV. After removing the resist, the substrate 101 is annealed in an electric furnace having an N$_2$ ambient at 1100° C. for 10 hours, so that the implanted ions are activated and thereby the N-type well 111 is formed.

Thereafter, the field regions defining the amplifier element Q1, the photoelectric transfer element PD1, the first initializing means S11 and the read means S13 are formed. More particularly, a silicon nitride film is grown to a thickness of 500 Å on the whole surface of the P-type silicon substrate 101. A resist pattern is formed on the field regions, and then the silicon nitride film is patterned by a dry etching process. Then, in order to prevent formation of a parasitic field transistor, boron ions are implanted at a dose of 8.0E12 atoms/cm$^2$ and 40 keV, and then the resist is removed. Thereafter, the substrate 101 is thermally oxidized at 900° C. for 5 hours by a conventional process, so that the field insulating films 105 for isolating the elements from each other are grown to a thickness of 5000 Å. The oxide film grown on the surface of the silicon nitride film is removed by a pyrogenec process, and the silicon nitride film is removed by hydrofluoric acid at 200° C., so that the field regions are defined.

A resist pattern used to perform channel doping for threshold voltage control for the amplifier element Q1 is formed in an area in which the amplifier element Q1 is to be formed. Then, phosphorus ions are implanted at a dose of 4.0E12 atoms/cm$^2$ and 90 keV, and the resist is removed. Thereafter, a resist pattern used to perform channel doping for threshold voltage control for the first initializing means S11 is formed in an area in which the means S11 is to be formed. Then, boron ions are implanted at a dose of 1.5E12 atoms/cm$^2$ and 25 keV, and the resist is removed. Subsequently, a thermal oxide film used to form the gate insulating films 122 and 132 is grown to 200 Å in a dry O$_2$ ambient at 910° C.

Then, a polysilicon film is grown to 3500 Å by an LPCVD in order to form the gate electrode 121 of the amplifier element Q1 and the gate electrode 131 of the first initializing means S11. In order to reduce the resistance of the polysilicon film, the polysilicon film is doped with phosphorus ions at a dose of 5.0E15 atoms/cm$^2$ and 40 keV. Then, a resist pattern for patterning the polysilicon film into a shape of the gates, and the polysilicon film is etched by dry etching. Thereafter, a resist pattern is formed on the source 123 and drain 124 of the amplifier element Q1 and the source 133 and drain 134 of the first initializing means S11. Then As ions are implanted at a dose of 5.0E15 atoms/cm$^2$ and 40 keV, and the resist is removed.

A resist pattern is formed on the high-density P-type region 112 of the photoelectric transfer element PD1. Then, BF$_3$ ions are implanted at a dose of 4.0E15 atoms/cm$^2$ and 40 keV, and the resist is removed. In order to activate the implanted BF$_3$ ions, the substrate 101 is annealed in an electric furnace having an N$_2$ ambient at 950° for 30 minutes. Thereafter, contact holes and metallic wiring lines are formed by a conventional LSI processes. In the above-mentioned process, the configuration shown in FIG. 7 is formed.

The inventors have confirmed that the device shown in FIG. 7 has sensitivity approximately 10 times that of the conventional device.

The structure shown in FIG. 7 has improved sensitivity, but has a large number of elements per pixel. Hence, the integration density is limited in case where the elements are simply arranged.

The inventors improved the structure of the elements in order to increase the integration density of the photoelectric transfer device.

Figure 8:
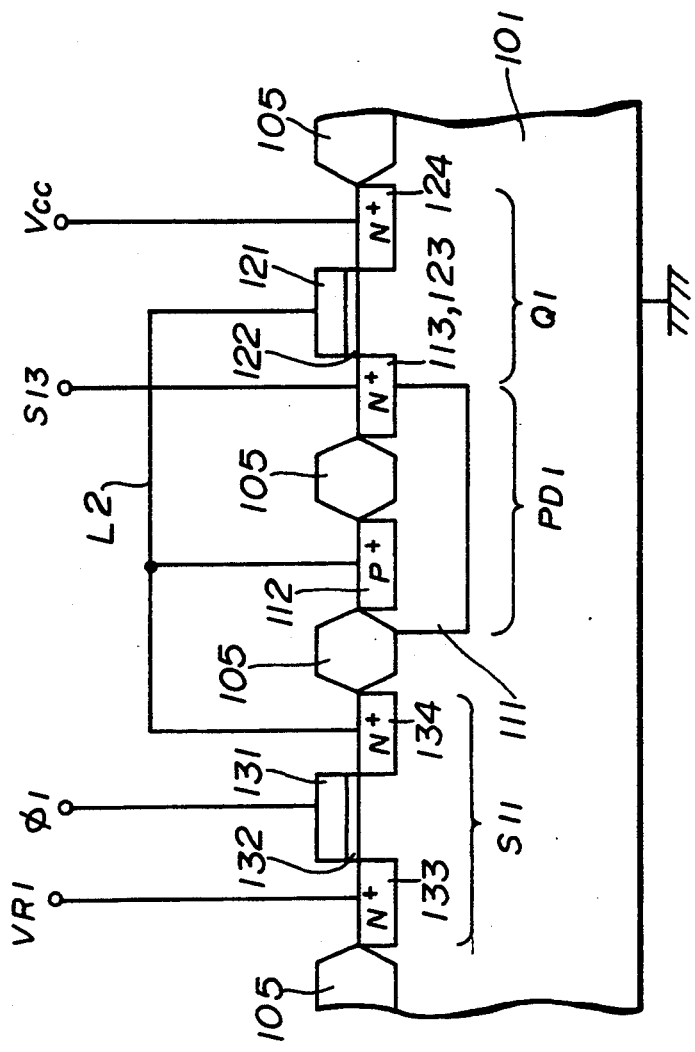
FIG. 8 is a cross-sectional view of another layer structure of the photoelectric transfer cell shown in FIG. 6.

FIG. 8 shows an improvement in the structure shown in FIG. 7 showing the structure of the photoelectric transfer cell C1 shown in FIG. 6. In FIG. 8, parts that are the same as those shown in FIG. 7 are given the same reference numbers.

In the structure of the photoelectric transfer device shown in FIG. 8, the photoelectric transfer element PDt is formed with a P+N-type photodiode, and the amplifier element Q1 is formed with a depletion-type N-channel MOSFET as in the case of the photoelectric transfer device shown in FIG. 7. However, the structure shown in FIG. 8 differs from that shown in FIG. 7 in that the N-type well 111 of the photoelectric transfer element PD1 includes a part of the source 123 of the amplifier element Q1. More particularly, the high-density N-type region 113 used to form the N-type side electrode (the electrode of the N-type well 111 of the photoelectric transfer element PD1 and the source 123 of the amplifier element Q1 are unified and that the high-density N-type region 113 also functions as the source of the amplifier element Q1. This structure makes it possible to omit the electrode wiring line L1 connecting the N-type well 11 of the photoelectric transfer element PD1 and the source 123 of the amplifier element Q1 used in the structure shown in FIG. 7 and hence to improve the integration density and reduce the wiring line resistance.

The photoelectric transfer device having the layer structure shown in FIG. 8 can be fabricated in the same manner as that of the device having the layer structure shown in FIG. 7 except for the following. That is, the process of forming the resist pattern in the field area is carried out so that the first initializing means S11 is formed and that the high-density P-type region 112 of the element PD1 and a part of the source i23 of the amplifier element Q1 are formed in the N-type well 111. The other parts of the layer structure shown in FIG. 8 can be made in the same manner as has been previously described with reference to FIG. 7.

In the device shown in FIG. 8, a part of the source 123 of the amplifier element Q1 is formed in the N-type well 111, and hence the on-chip area for formation of the elements can be reduced to approximately 90% of that for the layer structure shown in FIG. 7.

Figure 9:
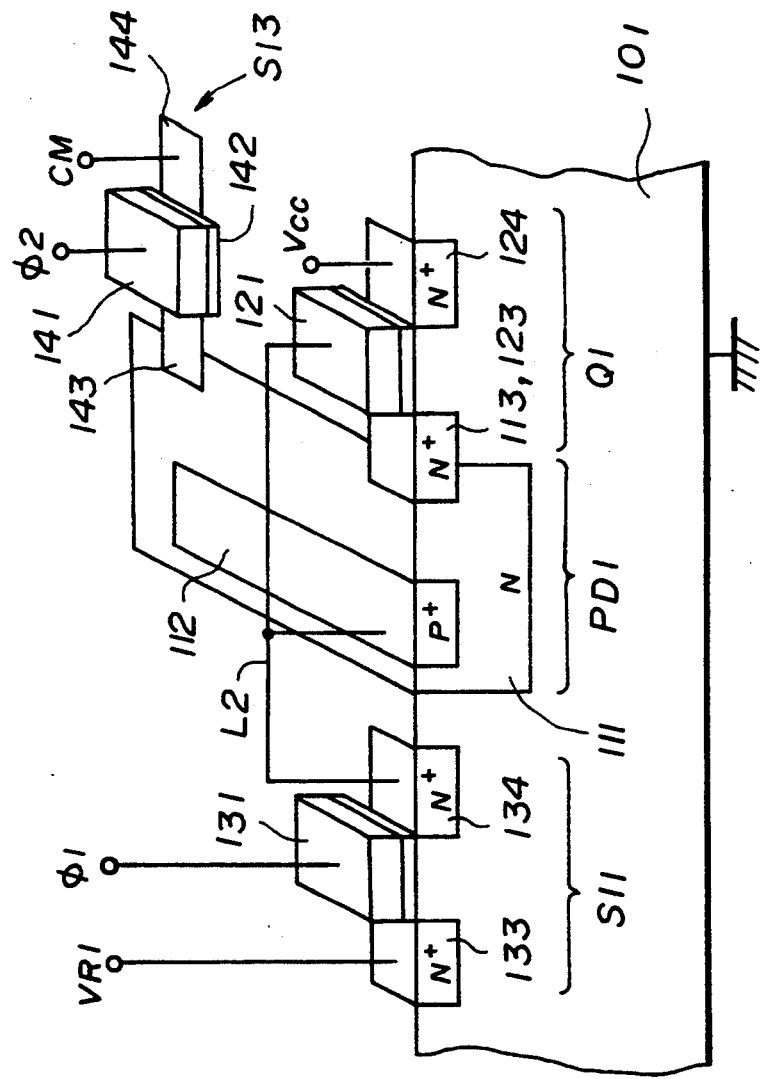
FIG. 9 is a perspective view of an improvement in the layer structure of the photoelectric transfer cell shown in FIG. 7.

FIG. 9 shows a layer structure in which the photoelectric transfer cell C1 is formed in the silicon substrate at a higher integration density. Referring to FIG. 9, the read means S13 is formed in the P-type silicon substrate 101 as an N-channel MOSFET. More particularly, a source (or drain) 143 and a drain (or source) 144 of the read means S13 are formed in the P-type silicon substrate 101. Further, a gate electrode 141 of the read means S13 is formed on the P-type silicon substrate 101 through a gate insulating film 142.

In the structures shown in FIGS. 7 and 8, the read means S13 is formed in the P-type silicon substrate 101 as an N-channel MOSFET (however it is to be noted that the read means S13 is not illustrated for the sake of simplicity). In the structures shown in FIGS. 7 and 8, the source 123 of the amplifier element Q1 and the source (or drain) of the read means S13 are connected to each other by an electrode wiring line. In the structure shown in FIG. 9, the N-type well 111 of the photoelectric transfer element PD1 contains the sourced(or drain) 143 of the read means S13. More particularly, in the structure shown in FIG. 9, the high-density N-type region 113 used to form an electrode of the N-type well 111, the source 123 of the amplifier element Q1, and the source (or drain) 143 of the read means S13 shown in FIG. 7 are unified. Further, the high-density N-type region 113 functions as not only the source 123 of the amplifier element Q1 but also the source (or drain) 143 of the read means S13. With the above structure shown in FIG. 9, it is possible to omit the electrode wiring line connecting the source 123 of the amplifier element Q1 and the source (or drain) 143 of the read means S13 to each other in the structures shown in FIGS. 7 and 8 and to hence increase the integration density and reduce the wiring line resistance. It will be noted that t he field oxide films 105 are not illustrated in FIG. 9 for the sake of simplicity.

The photoelectric transfer device having the layer structure shown in FIG. 9 can be fabricated by the same process as the process for fabricating the device having the structure shown in FIG. 8 except for the process for forming the source (or drain) of the read means S13. More specifically, the resist pattern forming process is carried out so that the first initializing means S11 is formed on the P-type silicon substrate 101 and at least parts of the high-density P-type region 112 of the photoelectric transfer element PD1 and the source 123 of the amplifier element Q1 as well as at least a part of the source (or drain) of the read means S13 are formed in the N-type well 111. The processes subsequent to the resist pattern forming process are the same as those for producing the photoelectric transfer device shown in FIG. 8.

In the photoelectric transfer device having the layer structure shown in FIG. 9, at least a part of the source (or drain) 143 of the read means S13 is formed in the N-type well 111, and hence the on-chip area can be reduced to approximately 85% of that for the layer structure shown in FIG. 8.

In the structures shown in FIGS. 6 through 9, a back gate of the depletion-type N-channel MOSFET functioning as the amplifier is the P-type silicon substrate 101 itself. When the potential of the source 123 of the amplifier element Q1 is read as the output signal Vout of the photoelectric transfer cell, the linearity of the photoelectric transfer device, that is, the input/output response will be deteriorated due to the substrate biasing effect of the amplifier element Q1.

In order to eliminate the above problem, the inventors provide an improved layer structure in which the back gate of the amplifier element Q is connected to the source thereof.

Figure 10:
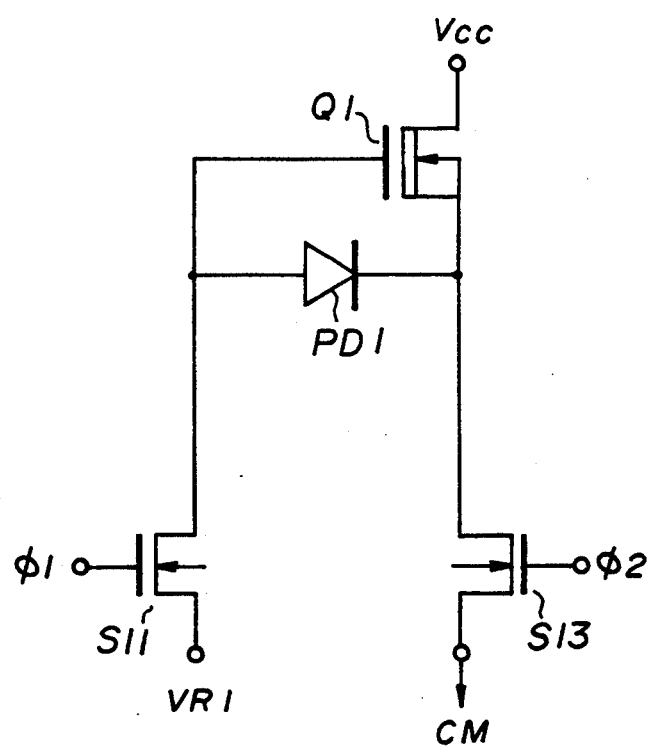
FIG. 10 is a circuit diagram of another structure of the photoelectric transfer cell used in the present invention.

FIG. 10 shows the photoelectric transfer cell C1 having such an improved layer structure. In the structure shown in FIG. 10, the back gate of the amplifier element Q1 is connected to the source thereof. With this connection, the potential of the back gate of the amplifier element Q1 is increased as the potential of the source thereof increases. As a result, it becomes possible to prevent the substrate biasing effect of the amplifier element Q1 to hence improve the linearity of the photoelectric transfer device, namely, the input/output response thereof.

The following should be considered in order to form n photoelectric transfer cells in the semiconductor substrate. That is, when thee back gates of the amplifier elements Qi (i=1−n) respectively formed with MOSFETs are respectively connected to the sources thereof, the source potentials of the amplifier elements Qi (i=1−n) are the output signals thereof. Hence, it is necessary to electrically isolate the back gates of the amplifier elements Qi (i=1−n) of the cells from each other.

Figure 11:
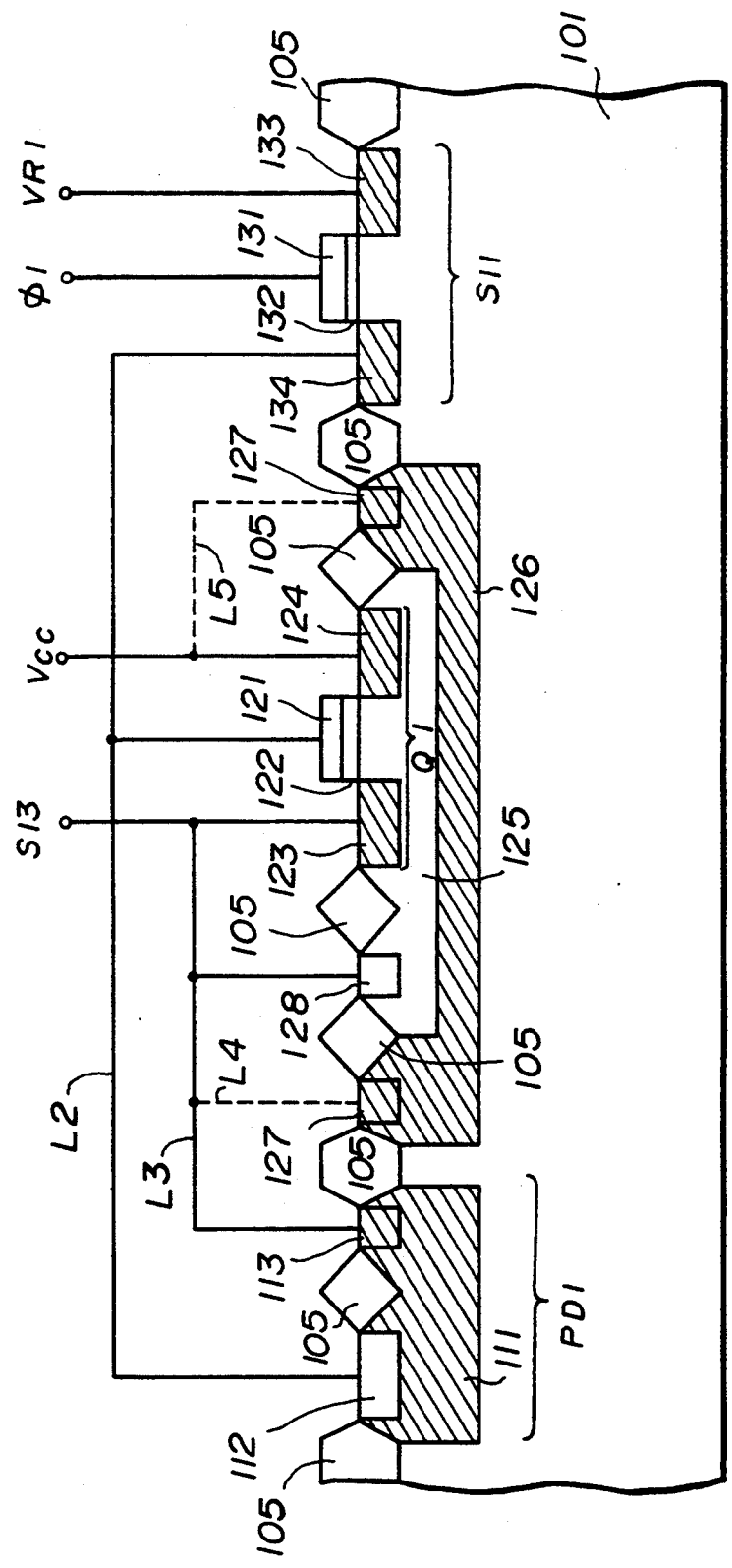
FIG. 11 is a cross-sectional view of a layer structure of the photoelectric transfer cell shown in FIG. 10.

FIG. 11 illustrates an improved layer structure of the photoelectric transfer cell C1 taking into account the above electrical isolation. The N-type well 111 is formed in the P-type silicon substrate 101, and the high-density P-type region 112 is formed in the N-type well 111. The N-type well 111 and the high-density P-type region 112 form a P+N photodiode. An N-type well 126 is formed in the P-type silicon substrate 101, and a P-type well 125 is formed in the N-type well 126. A source 123 and a drain 124 of a depletion type N-channel MOSFET functioning as the amplifier element Q1 are formed in the P-type well 125. Further, in the P-type silicon substrate are formed the source 133 and the drain 134 of the N-channel MOSFET functioning as the first initializing means S11. The gate electrode 121 of the amplifier element Q1 and the gate electrode 131 of the first initializing means S11 are formed on the P-type silicon substrate 10 through the gate insulating films 122 and 132, respectively. The P-type well 126 is electrically isolated from the P-type silicon substrate 101 by means of the N-type well 126.

The high-density N-type region 113 used to form the N-type side electrode (the electrode of the N-type well 111) of the photoelectric transfer element PD1 is formed in the N-type well 111. A high-density N-type region 127 used to form an electrode of the N-type well 126 is formed inn the N-type well 126. A high-density P-type region 128 used to form an electrode of the P-type well 125 is formed in the P-type well 125. An electrode wiring line L3 connects the high-density N-type region 113 in the N-type well 111, the high-density P-type region 28 in the P-type well 125 and the source 123 of the amplifier element Q1 to each other. As indicated by broken lines in FIG. 11, the high-density N-type region 121 may be connected to the source 123 of the amplifier element Q1 by an electrode wiring line L4 or to the drain 124 of the amplifier element Q1 by an electrode wiring line L5. It is also possible to maintain the high-density N-type region 127 at a potential independent of the potentials of the other elements.

In the lair structure shown in FIG. 11, the P-type well 125 functions as the back gate of the amplifier element Q1, and is electrically isolated from the P-type silicon substrate 101 by means of the N-type well 126. Further, the back gate 125 is connected to the source 123 of the amplifier element Q1, and is thus maintained at the same potential as the source 123. Hence, the potential of the P-type well 125 (that is, the back gate of the amplifier element Q1) is increased as the potential of the source 123 of the amplifier element Q1. Hence, it is possible to prevent the substrate biasing effect and hence improve the input/output response (linearity).

More concretely, the photoelectric transfer device having the layer structure shown in FIG. 11 can be fabricated by the same process as that having the layer structure shown in FIG. 7 except for the following. That is, the N-type well 126 is formed in the P-type silicon substrate 101, and the P-type well 125 is formed in the N-type well 126. The photoelectric transfer device shown in FIG. 11 can be fabricated in the following process.

First, a resist pattern is formed so that the N-type well 126 can be formed in the N-type well 111 at the same times as the N-type well 111. Next, the ion implantation process and the annealing process are subsequently carried out, so that the N-type well 111 and the N-type well 126 are formed. Then, a resist pattern is formed so that the P-type well 125 is formed in the N-type well 126, and boron ions are implanted in the surface portion of the N-type well at a dose of 8.0E12 atoms/cm$^2$ and 40 keV. Thereafter, the resist is removed, and the substrate 101 is annealed in the electric furnace having an $N_2$ gas ambient at 1050° C. for 8 hours in order to activate the implanted ions. Thereby, the P-type cell 125 is formed. Thereafter, the same processes as described previously are carried out.

In the photoelectric transfer device having the layer structure shown in FIG. 11, the P-type well 126 functioning as the back gate of the amplifier element Q1 is electrically isolated from the P-type silicon substrate 101, so that the back gate and the source 123 of the amplifier element Q1 are connected to each other and the substrate biasing effect of the amplifier element Q1 can be prevented. Hence, an improved input/output response (more concretely, the linear performance with 3 V being applied to the device can be improved by approximately 5%) can be obtained.

The inventors took into account the layer structure shown in FIG. 11 in which the N-type well 126 has the same conductivity as the N-type well 111, and made a further improved layer structure in which the N-type well 126 and the N-type well 111 of the photoelectric transfer element PD1 are unified.

Figure 12:
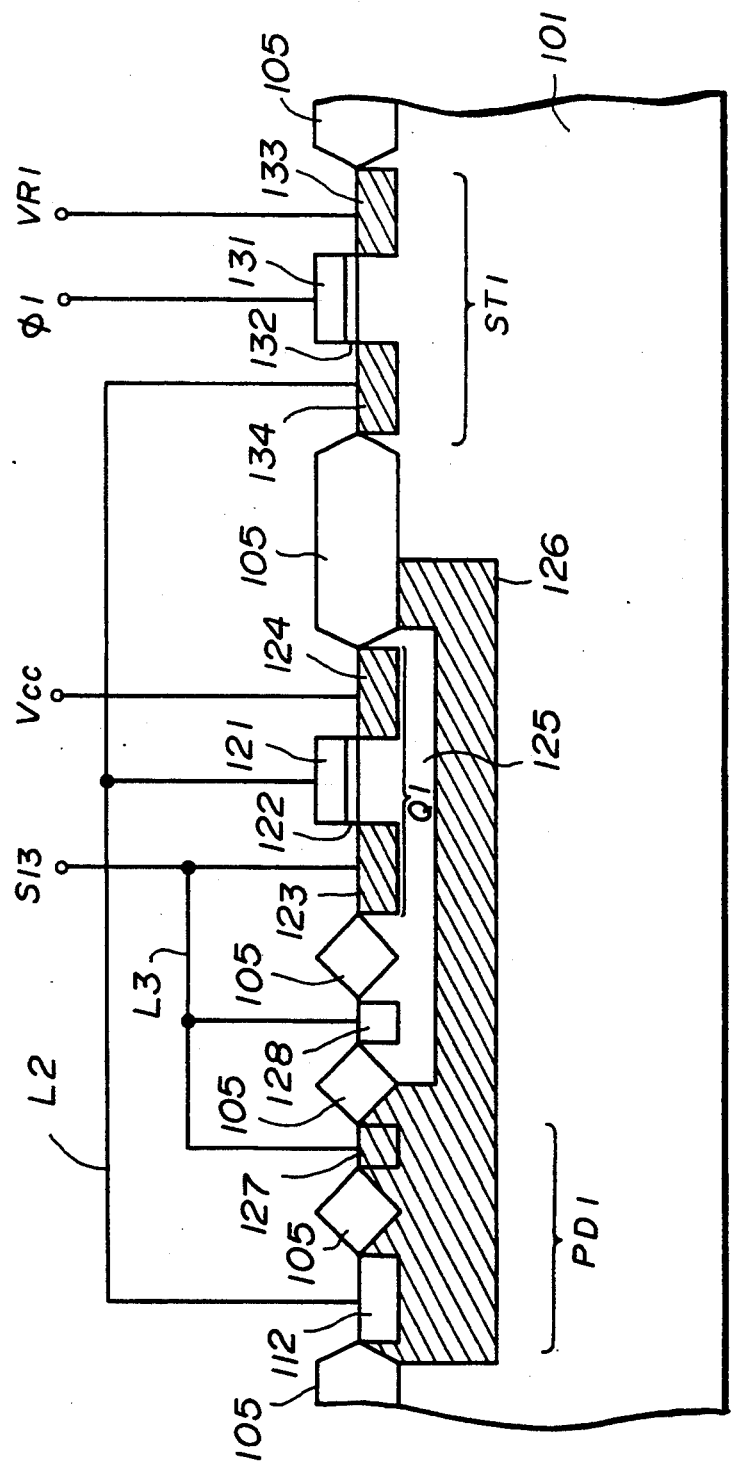
FIG. 12 is a cross-sectional view of an improvement in the layer structure shown in FIG. 10.

FIG. 12 shows such a further improved layer structure of the photoelectric transfer cell C1 in which the N-type well 126 and the N-type cell 111 are unified in the silicon substrate 101.

In the layer structure shown in FIG. 12, it is not necessary to separately form the high-density N-type region 113 of the N-type well 111 and the high-density N-type region 127. Hence, it is enough to form only one electrode connected to, for example, the high-density N-type region 127. Further, it is not necessary to provide a space used to isolate the N-type well 111 and the N-type well 126. Hence, the integration density can be further improved.

Figure 13:
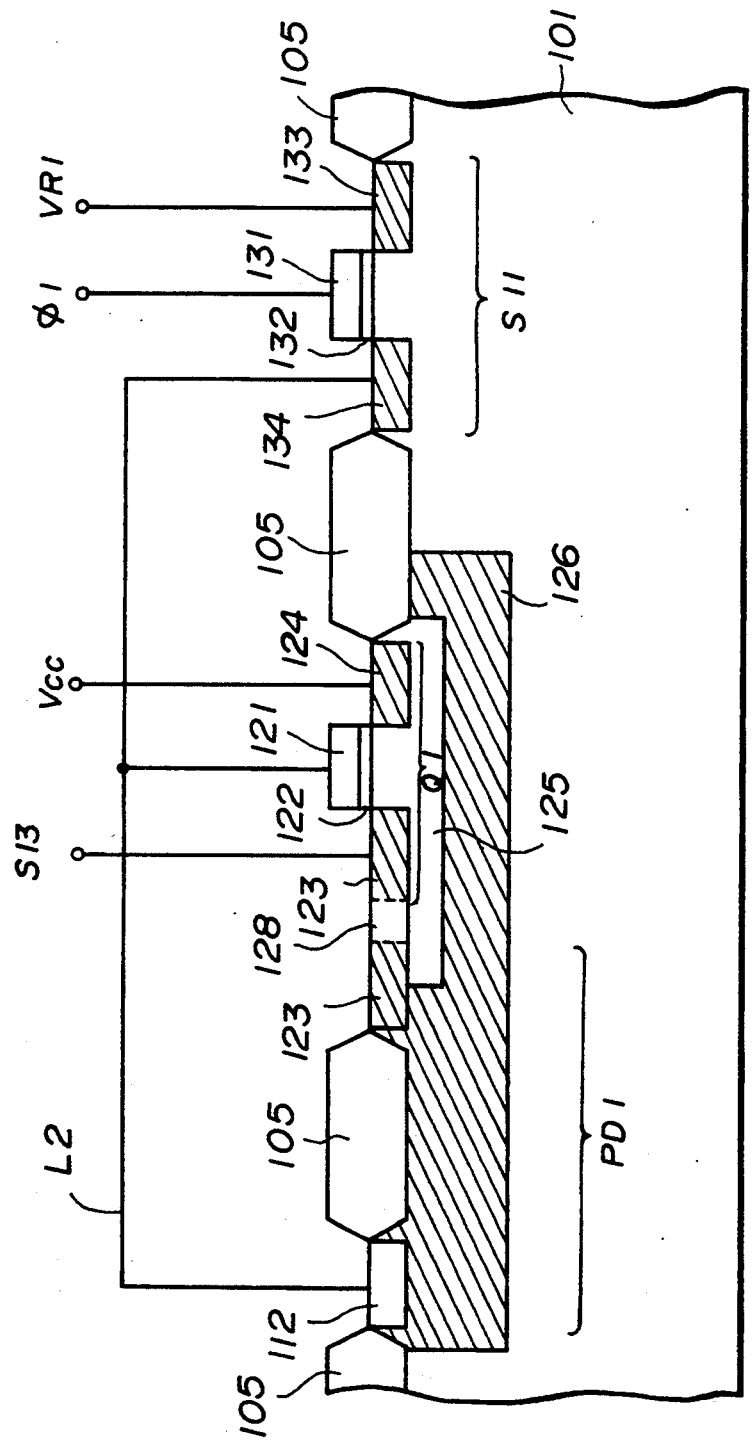
FIG. 13 is a cross-sectional view of another improvement in the layer structure shown in FIG. 10.

FIG. 13 shows a variation of the layer structure shown in FIG. 12 in which at least a part of the source 123 of the amplifier element Q1 is included in the N-type well 126.

In the layer structure shown in FIG. 13, at least a part of the source 123 of the amplifier element Q1 is included in the N-type well 126. Hence, it is not necessary to provide the electrode wiring line L3 connecting the source 123 of the amplifier element Q1, the N-type well 126 and the P-type well 125 functioning as the back gate of the amplifier element Q1. Further, the field oxide films 105 can be omitted. Hence, the integration density can be further enhanced.

The layer structures shown in FIGS. 12 and 13 can be formed by partially changing the processes for forming the layer structures shown in FIGS. 7, 8, 9 and 10 in such a manner that resist patterns different from those used to form the layer structures shown in FIGS. 7, 8, 9 and 10 are used at the time of forming the field region, the high-density N-type region and the high density P-type region.

In the circuit configuration shown in FIG. 6, as in the case of a sensor using a reduction optical system, as the area of the photoelectric transfer element is decreased, not only the parasitic capacitance of the photoelectric transfer element but also the capacitance between the source (or drain) of the MOSFET functioning as the first initializing means and the substrate cannot be ignored as the capacitance (storage capacitance) connected to the amplifier element.

Figure 14:
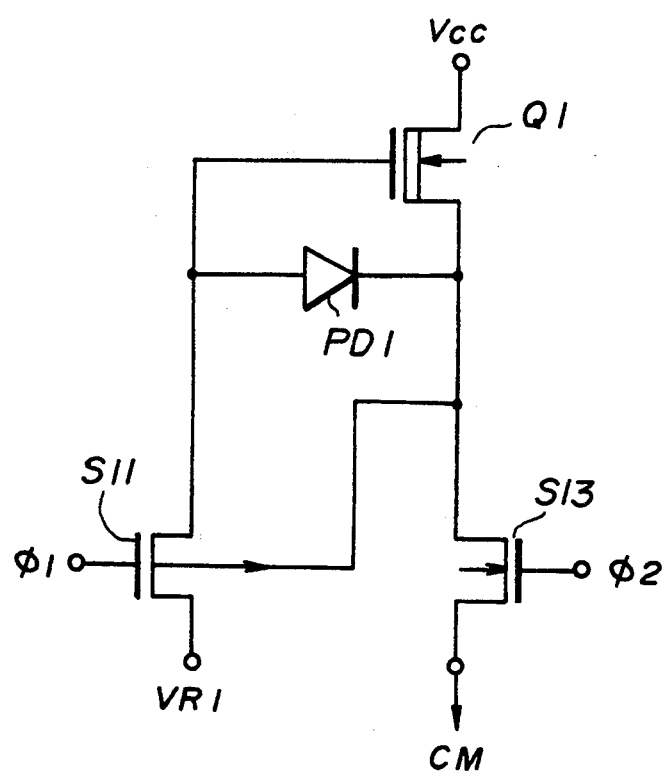
FIG. 14 is a circuit diagram of yet another configuration of the photoelectric transfer cell used in the present invention.

FIG. 14 shows a structure of the photoelectric transfer cell C1 intended to the capacitance between the substrate and the source (or drain) of the MOSFET functioning as the first initializing means S11. In the circuit configuration shown in FIG. 14, the amplifier element is formed with a depletion-type N-channel MOSFET and the read means S13 is formed with a depletion-type N-channel MOSFET as in the case of the photoelectric transfer cell C1 shown in FIG. 6. However, the layer structure shown in FIG. 14 differs from that shown in FIG. 6 in that the back gate of the first initializing means (MOSFET) S11 is connected to the source of the amplifier element Q1. With the above connection, it is possible to reduce the influence of the capacitance between the substrate and the source (or drain) of the MOSFET serving as the first initializing means S11 and to improve the sensitivity of the photoelectric transfer device by the same principle as has been described with reference to FIG. 2. The layer structure shown in FIG. 14 uses, as the first initializing means S11, a P-channel MOSFET rather than an N-channel MOSFET. This is because the amplifier element Q1 is formed with a depletion-type N-channel MOSFET and thus the source potential of the amplifier element Q1 is higher than the gate potential thereof.

The following should be considered in order to form n photoelectric transfer cells in the semiconductor substrate. That is, when the back gates of the amplifier elements Qi (i=1−n) respectively formed with MOSFETs are respectively connected to the sources thereof, the source potentials of the amplifier elements Qi (i=1−n) are the output signals thereof. Hence, it is necessary to electrically isolate the back gates of the amplifier elements Qi (i=1−n) of the cells from each other.

Figure 15:
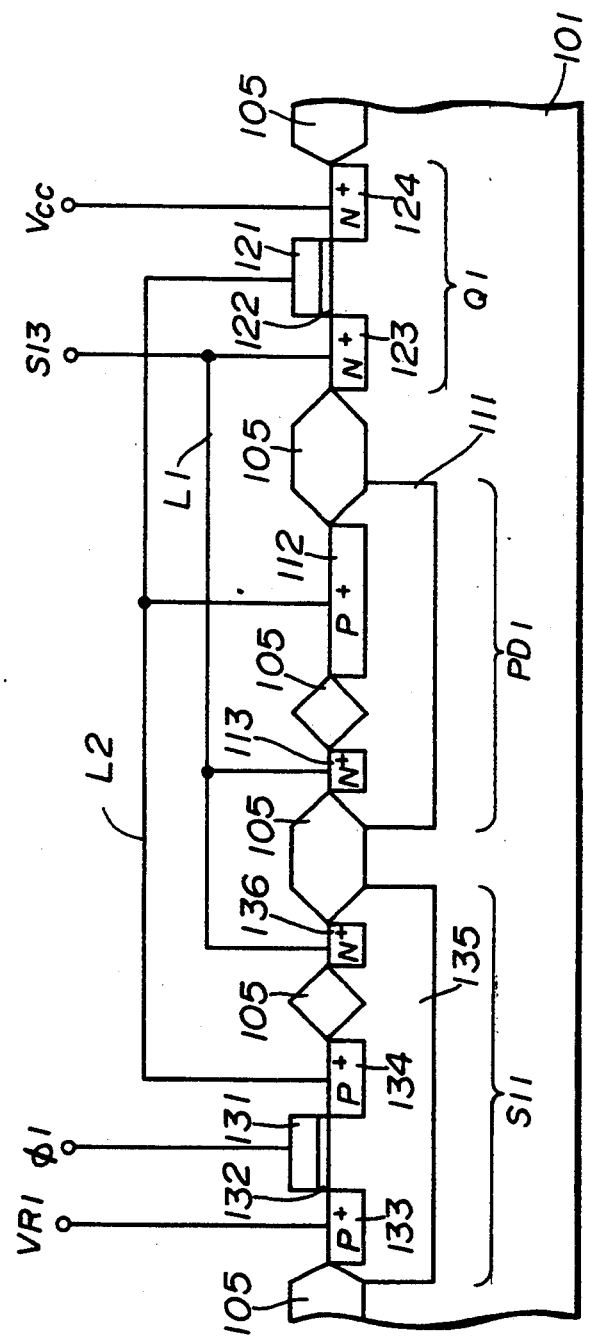
FIG. 15 is a cross-sectional view of a layer structure of the photoelectric transfer cell shown in FIG. 14.

FIG. 15 shows an improved layer structure of the photoelectric transfer cell C1 taking into account the above. In the layer structure shown in FIG. 15, the photoelectric transfer element PD1 is formed in the P-type silicon substrate 101 as a P+N photodiode, and the amplifier element Q1 is formed with a depletion-type N-channel MOS transistor, as in the case of the layer structure shown in FIG. 7. However, the layer structure shown in FIG. 15 differs from that shown in FIG. 7 in that an independent N-type well 135 is formed in the P-type silicon substrate 101 per pixel, and a source 134 and a drain 138 of the P-channel MOSFET functioning as the first initializing means S11 are formed; in the N-type well 135.

A high-density region 136 used to form an electrode of the N-type well 135 is formed in the N-type well 135. The N-type well 111 of the photoelectric transfer element PD1 is connected, by means of the electrode wiring line L1, to the source 123 of the amplifier element Q1 and the high-density N-type region 136 in the N-type well 135. The high-density P-type region 112 of the photoelectric transfer element PD1 is connected, by means of the electrode wiring line L2, to the gate electrode 121 of the amplifier element Q1 and the source 134 of the first initializing means S11. The field insulating films 105 electrically isolate the elements, that is, the photoelectric transfer element PD1 and the amplifier element Q1 and the first initializing means S11 from each other. The layer structure corresponding to the read means S13 is omitted as in the case of that shown in FIG. 7 for the sake of simplicity.

In the layer structure shown in FIG. 15, the N-type well 135 used to form the first initializing means S11 is independently provided per pixel, and thus can be connected to the source 123 of the amplifier element Q1. The N-type well 135 is the back gate of the P-channel MOSFET serving as the first initializing means S11, and is connected to the source 123 of the amplifier element Q1. Hence, the capacitance formed between the substrate 135 and the source 134 of the first initializing means S11 can be substantially reduced and thus the capacitance connected to the gate of the amplifier element Q1 can be further decreased. As a result, the sensitivity of the photoelectric transfer device can be further improved.

The layer structure shown in FIG. 15 can be formed in the following process that is mainly based on the process for forming the layer structure shown in FIG. 7. More specifically, the N-type wells 111 and 135 are formed in the surface portion of the P-type silicon substrate 101, and then the field oxide regions are formed. Then, phosphorus ions used for threshold voltage control of the amplifier element Q1 are implanted at a dose of 4.0E12 atoms/cm$^2$ and 90 density keV. Thereafter, boron ions are implanted in the area where the first initializing means S11 is to be used at a dose of 3.0E12 atoms/cm$^2$ and 25 keV. Then, the gate insulating films 122 and 123 are formed.

Then, the gate electrodes 121 and 131 are formed, and then As ions are implanted in the source 123 and drain 124 of the amplifier element Q1 at a dose of 5.0E15 atoms/cm$^2$ and 40 keV. Thereafter, BF$_2$ ions are implanted i n the high-density P-type region 112 and the source 133 and drain 134 of the first initializing means S11 at a dose of 4.0E15 atoms/cm$^2$ and 40 keV. Thereafter, the substrate 101 is annealed in the electric furnace containing an N$_2$ ambient at 950° C. for 30 minutes. Thereafter, the same process as that for fabricating the photoelectric transfer device shown in FIG. 7 is performed.

In the photoelectric transfer element having the layer structure shown in FIG. 15, the N-type well 135 that is the back gate of the first initializing means S11 is independent per pixel, and hence can be connected to the source 123 of the amplifier element Q1. As a result of the above improvements, it is possible to reduce the influence of the capacitance between the substrate 135 and the drain 134 of the first initializing means S11 and hence to improve sensitivity three times that of the photoelectric transfer device having the layer structure shown in FIG. 7.

Figure 16:
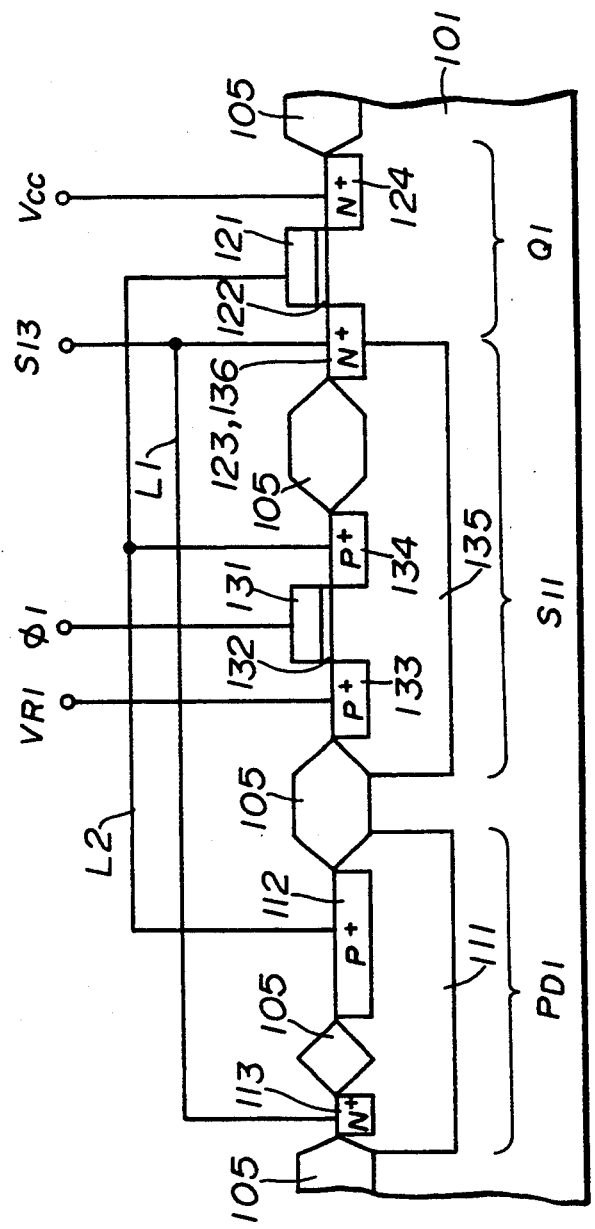
FIG. 16 is a cross-sectional view of an improvement in the layer structure of the photoelectric transfer cell shown in FIG. 15.

FIG. 16 shows an improved structure of the cell C1 based on the layer structure shown in FIG. 15, in which at least a part of the source 123 of the amplifier element Q1 is included in the N-type well 135 functioning as the back gate of the first initializing means S11. As shown in FIG. 16, at least a part of the source 123 of the amplifier element Q1 is included in the N-type well 135 in which the first initializing means S11 is formed. The high-density N-type region 136 used to form an electrode of the N-type well 135 is formed so as to function as the source 123 of the amplifier element Q1. In the above layer structure shogun in FIG. 16, it is not necessary to use the electrode wiring line L1 connecting the N-type well 135 functioning as the back gate of the first initializing means S11 and the source 123 of the amplifier element Q1. The N-type well 135 and the source 123 of the amplifier element Q1 are connected to each other within the P-type silicon substrate 101. Hence, as compared with the layer structure shown in FIG. 15, the layer structure shown in FIG. 16 has a high integration density, and the wiring line resistance can be reduced.

Further, the N-type well 135 functioning as the back gate of the first initializing means S11 can be made to function as an area having one conductivity of the photoelectric transfer element.

Figure 17:
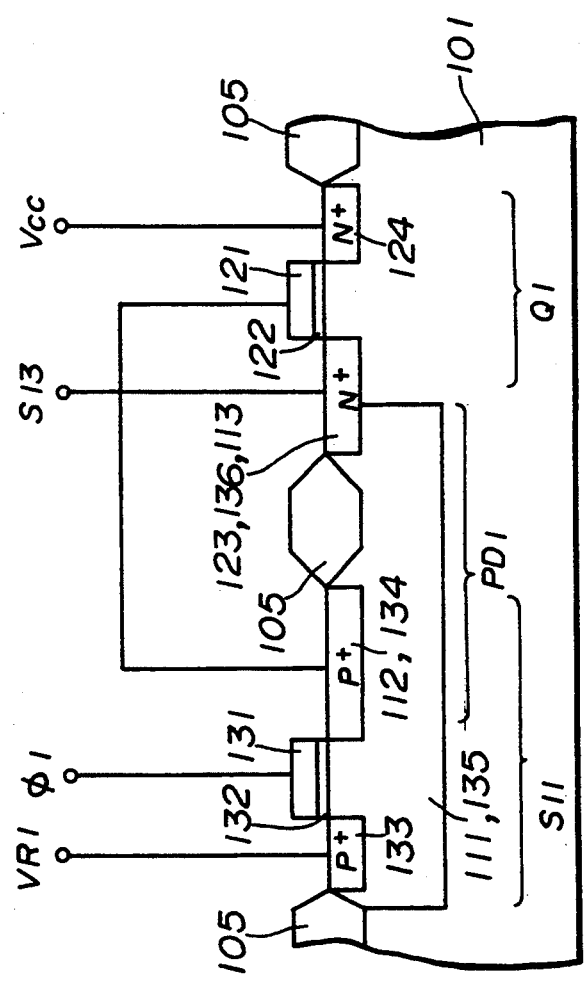
FIG. 17 is a cross-sectional view of another improvement in the layer structure of the photoelectric transfer cell shown in FIG. 15.

FIG. 17 shows an improved layer structure of the photoelectric transfer cell C1 based on that shown in FIG. 16, in that the N-type well 135 functioning as the back gate of the first initializing means S11 can be made to function as an area having one conductivity of the photoelectric transfer element. More particularly, in the layer structure shown in FIG. 17, the source 134 of the P-channel MOSFET functioning as the first initializing means S11 and the high-density P-type area of the photoelectric transfer element PD1 are unified, and the N-type well 135 functioning as the back gate of the first initializing means S11 and the N-type well 111 of the photoelectric transfer element PD1 are unified. Further, at least a part of the source 123 of the amplifier element Q1 is included in the unified N-type well (111, 135), and a high-density N-type region (113, 136) used to form an electrode of the unified N-type well (111, 135) is formed so as to function as the source of the amplifier element Q1.

In the above layer structure shown in FIG. 17, the source 134 of the first initializing means S11 and the high-density P-type region 112 of the photoelectric transfer element PD1 are unified, and the N-type well 135 functioning as the back gate of the first initializing means S11 and the N-type well 111 of the photoelectric transfer element PD1 are unified. The unified N-type well (111, 135) and the source 123 of the amplifier element Q1 are connected to each other in the P-type silicon substrate 101. Hence, the integration density and the connection wiring line resistance can be further improved.

Figure 18:
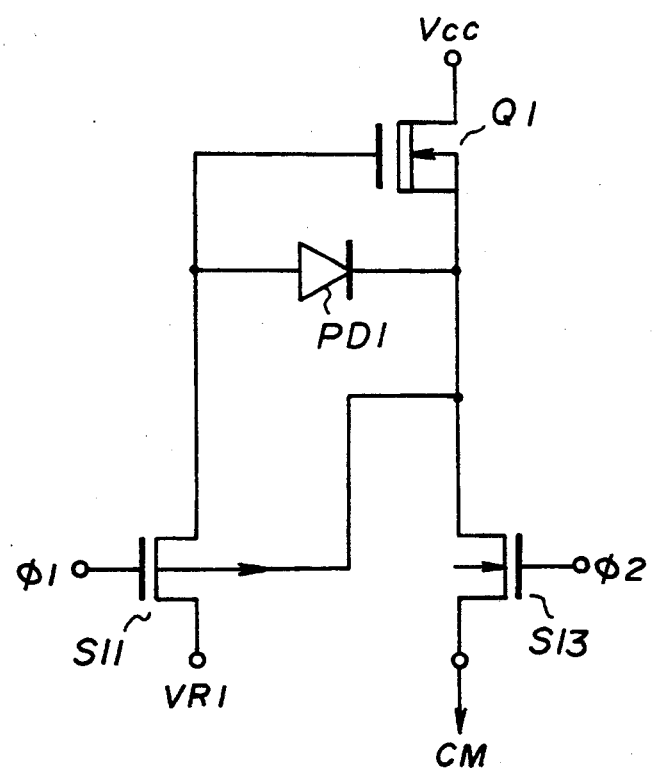
FIG. 18 is a circuit diagram of yet another circuit configuration of the photoelectric transfer cell used in the present invention.

FIG. 18 shows an improved circuit configuration of the photoelectric transfer cell C1 based on the circuit configuration shown in FIG. 14, in which the back gate of the amplifier element Q1 is connected to the source thereof.

Figure 19:
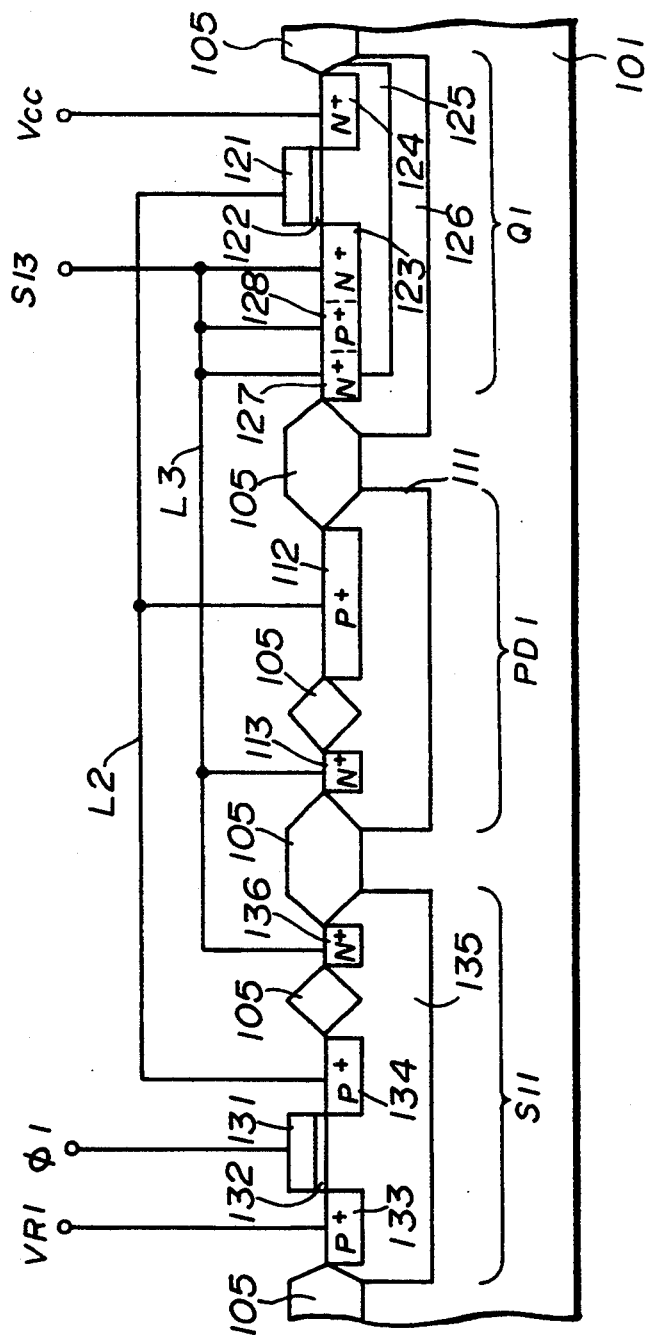
FIG. 19 is a cross-sectional view of a layer structure of the photoelectric transfer cell shown in FIG. 18.

FIG. 19 shows a layer structure in which the photoelectric transfer cell C1 shown in FIG. 18 is formed in a silicon substrate. The layer structure shown in FIG. 19 differs from that shown in FIG. 15 in a structure regarding the amplifier element Q1. More particularly, in the layer structure shown in FIG. 19, the N-type well 126 is formed in the P-type silicon substrate 101, and the P-type well 125 is formed in the N-type well 126. The source 123 and drain 124 of the N-channel MOS FET functioning as the amplifier element Q1 are formed in the P-type well 125. The P-type well 125 functions as the back gate of the amplifier element Q1, and the N-type well 126 electrically isolates the P-type well 125 functioning as the back gate from the P-type silicon substrate 101. Further, the high-density N-type region 127 used to form an electrode of the N-type well 126 is formed in the N-type well 126, and the high-density P-type region 128 used to form an electrode of the P-type well 125 is formed in the P-type well 125. The electrode wiring line L3 connects the high-density N-type region 127, the high-density P-type region 128 and the source 123 of the amplifier element Q1 to each other. That is, by means of the electrode wiring line L3, the back gate of the amplifier element Q1, that is, the P-type well 125 is electrically connected to the source 123 of the amplifier element Q1.

In the layer structure shown in FIG. 19, the back gate of the amplifier element Q1 and the source thereof are electrically connected to each other, and the potential of the back gate of the amplifier element Q1 is maintained at the source potential of the amplifier element Q1. Hence, it is possible to ignore the substrate biasing effect of the amplifier element Q1 and to improve the input/output response (the linear response characteristic) of the photoelectric transfer device.

Figure 20:
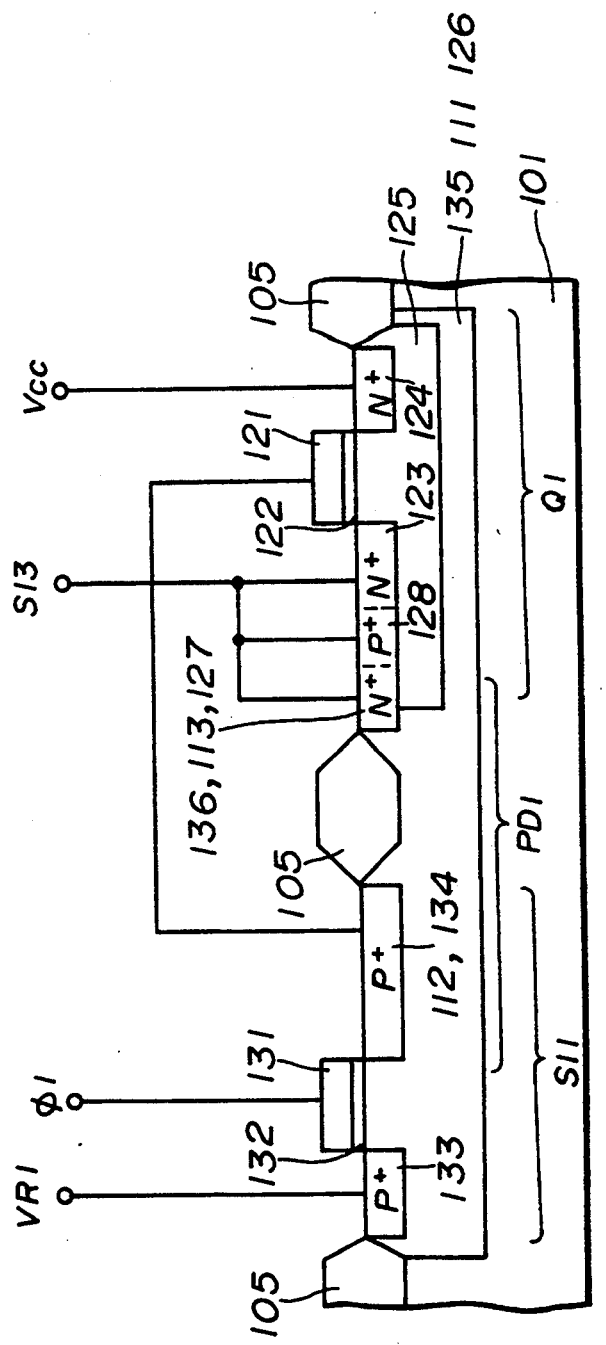
FIG. 20 is a cross-sectional view of an improvement in the layer structure shown in FIG. 19.

FIG. 20 shows another structure of the photoelectric transfer cell C1 shown in FIG. 18. In the layer structure shown in FIG. 20, the N-type well 135 of the first initializing means S11 and the N-type well 111 of the photoelectric transfer element PD1 and the N-type well 126 of the amplifier element Q1 are unified. Further, the drain 134 of the first initializing means S11 and the high-density P-type region 112 of the photoelectric transfer element PD1 are unified. Furthermore, the high-density N-type region (113, 136) of the unified N-type well (111, 135) used to form an electrode of the unified well is made to function as the source 123 of the amplifier element Q1. With the above layer structure, it is possible to further improve the integration density and reduce the wiring line resistance.

The layer structures shown in FIGS. 16 and 17 and FIGS. 19 and 20 can be formed by partially changing the processes for forming the layer structures shown in FIGS. 7, 8, 9 and 10 in such a manner that resist patterns different from those used to form the layer structures shown in FIGS. 7, 8, 11 and 15 are used at the time of forming the field region, the high-density N-type region and the high-density P-type region.

Figure 21:
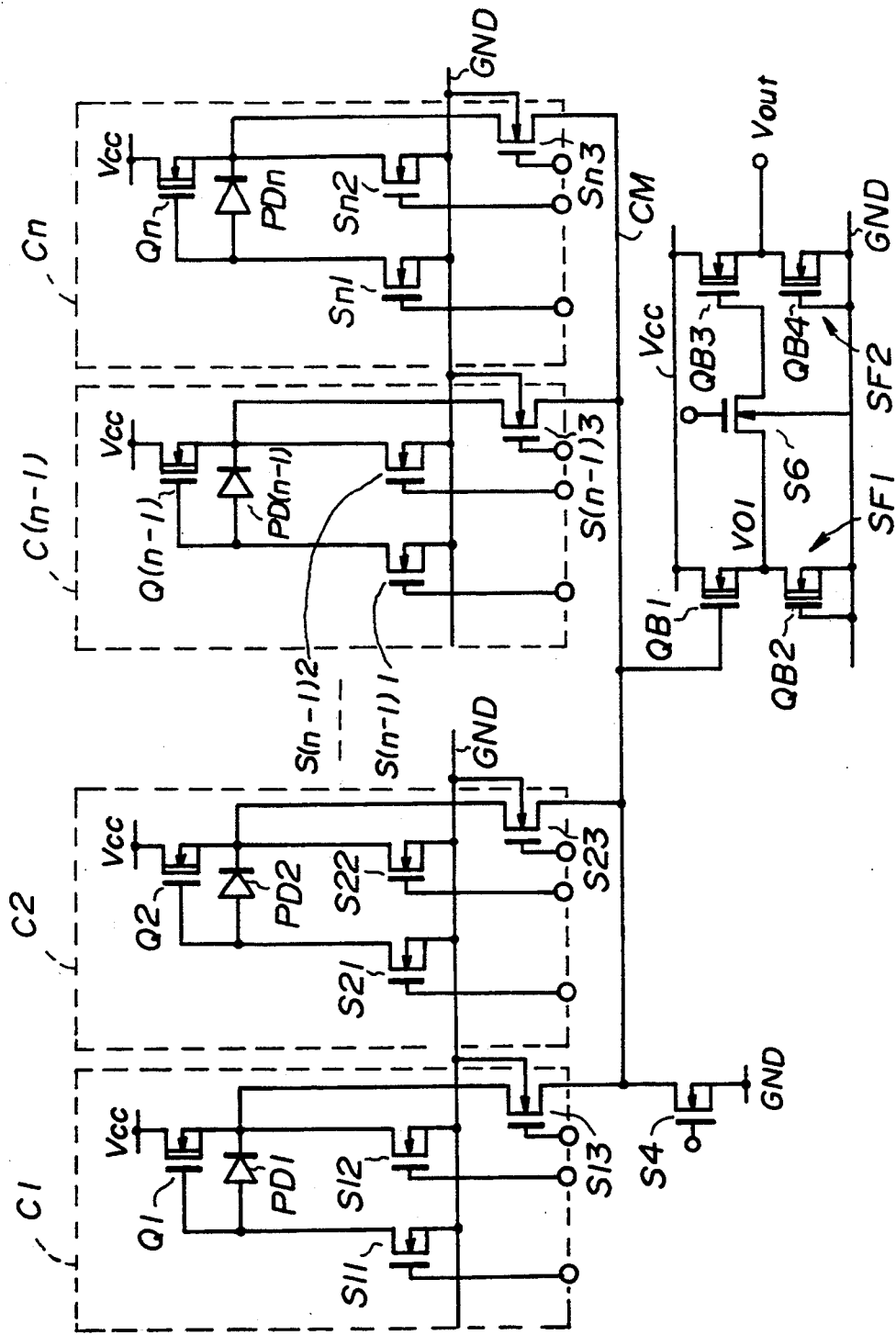
FIG. 21 is a circuit diagram of a concrete example of the photoelectric transfer device shown in FIG. 2.

FIG. 21 shows a concrete example of the photoelectric transfer device shown in FIG. 2. The device shown in FIG. 21 includes n photoelectric transfer elements respectively having the same structure as each other. For example, the nth photoelectric transfer cell Cn is configured so that the photoelectric transfer element PDn is formed with a photodiode, the amplifier element Qn with a depletion-type N-channel MOSFET, the first initializing means Sn1 with an N-channel MOSFET, the second initializing means Sn2 with an N-channel MOSFET, and the read means Sn3 with an N-channel MOSFET. Further, the third initializing means S4 is formed with an N-channel MOSFET, and the potentials VR1, VR2 and VR3 used for the initialization are set to 0 V (GND). Instead of the amplifier AMP shown in FIG. 2, the circuit show in FIG. 21 includes a first-stage source follower circuit SF1 composed of amplifier elements QB1 and QB2, a second-stage source follower circuit SF2 composed of amplifier elements QB3 and QB4, and a switch S6. The switch S6 is operated in the phase reverse to that of the third initializing means S4.

Figure 22:
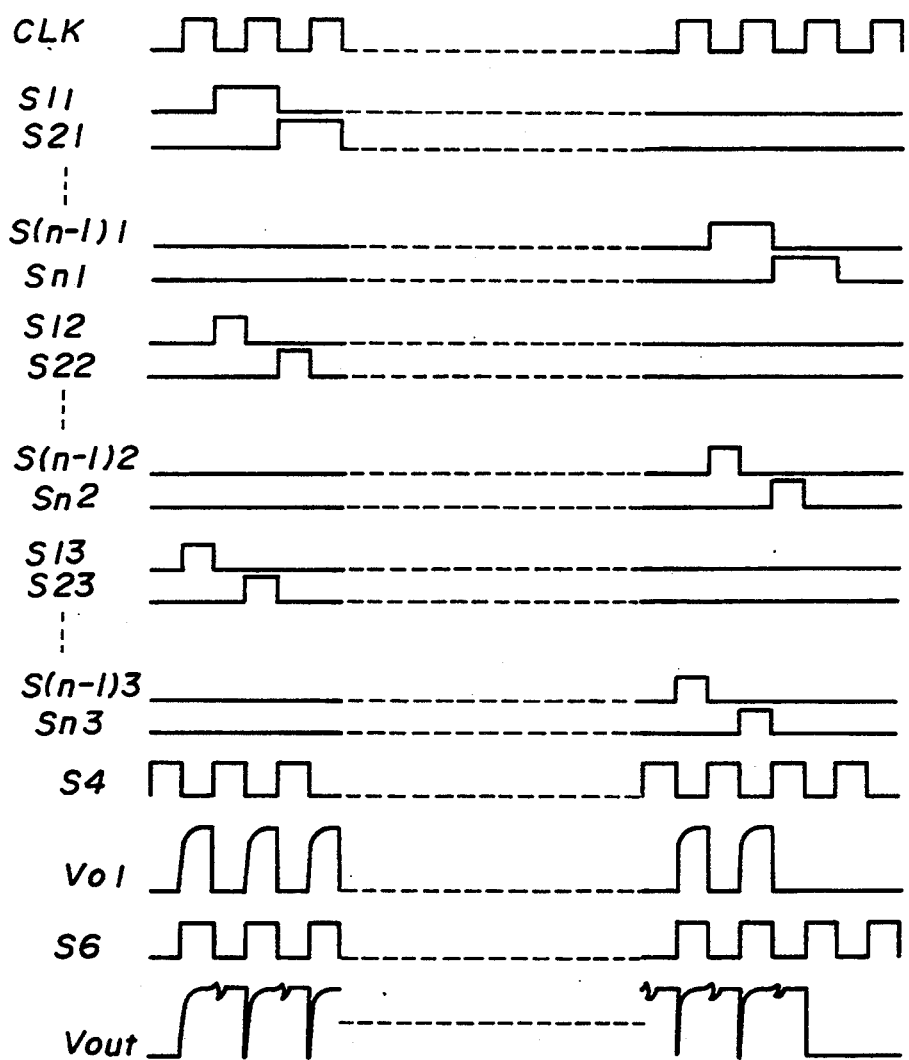
FIG. 22 is a time chart showing the operation of the photoelectric transfer device shown in FIG. 21.

FIG. 22 is a time chart showing the operation of the photoelectric transfer device shown in FIG. 21. The device shown in FIG. 21 operates in synchronism with the aforementioned clock signal CLK having a predetermined period. More particularly, the n photoelectric transfer cells C1–Cn are sequentially initialized one by one every cycle in such a manner that the first cell C1 is initialized within one period of the clock signal CLK and the second cell C2 is initialized within the next period thereof. When the initializing operation on a cell is completed, the photoelectric transfer process of the above cell is initiated. For example, in the photoelectric transfer cell C1 of interest, the switches S11 and S12 are turned ON and the gate potential and the source potential of the amplifier element Q are set to the ground potential, so that the cell C1 can be initialized. Next, the switch S12 is turned OFF, and hence the potential of the source of the amplifier element Q1 charges the parasitic capacitance of the source of the switch S12 and the stray capacitance of the source thereof. Then, the source potential of the amplifier element Q1 is settled at a potential higher than the gate potential by the gate-source voltage Vth.

Thereafter, the switch S is turned OFF. When a photoelectric current based on the quantity of light incident to the photoelectric transfer element PD1 flows therein, the capacity (storage capacity) connected to the gate of the amplifier element Q1 is started to be charged. In this manner, a charge based on the photoelectric current is stored in the capacitor coupled to the gate of the amplifier element Q1, and the gate potential of the amplifier element Q1 is raised. At the same time as the gate potential of the amplifier element Q1 is raised, the source potential is raised by an increase in the gate potential while the parasitic capacitor of the switch S12 and the stray capacitor of the source are charged. In the above manner, the amplifier element Q1 functions as a source follower in which the source voltage is changed so as to follow up the gate voltage. Hence, the gate-source voltage of the amplifier element Q1 is maintained at the constant voltage Vth.

In the circuit configuration shown in FIG. 21, the photoelectric transfer element PD1 is connected between the gate and source of the amplifier element Q1, and thus the gate-source voltage of the amplifier element Q1 functioning as the source follower, that is, the constant Vth is applied to the photoelectric transfer element PD1. Hence, the charge stored in the parasitic capacitor of the photoelectric transfer element PD1 is approximately constant and is little varied. Hence, it becomes possible to greatly reduce the influence of the parasitic capacitance of the photoelectric transfer element PD1 to the storage capacitance. This is equivalent to a situation that the parasitic capacitance of the element PD1 is substantially subtracted from the storage capacitance, and hence the storage capacitance is substantially reduced. The photoelectric transfer device shown in FIG. 21 has sensitivity approximately 10 times that of the conventional photoelectric transfer device.

The photoelectric transfer element C1 is initialized again after a predetermined read time (storage time) elapses. The switch S13 is turned ON in the half period of the clock signal CLK immediately prior to the above initialization, and the source potential obtained immediately prior to the initialization is output, as the output signal, to the common signal line CM. The source potential output to the common signal line CM is applied to the first-stage source follower circuit SF made up of the amplifier elements QB1 and QB2. The source follower circuit SF1 functions to transfer the input/output impedance, and outputs a corresponding output signal VO1.

In the next half cycle of the clock signal CLK, the switch S13 is turned OFF and the switch S4 is turned ON, so that the potential of the common signal line CM is initialized to, the ground (GND; 0 V). At the same time, the switches S11 and S12 are turned ON, and hence the gate potential of the amplifier element Q1 is initialized. The second through nth photoelectric transfer cells C2 through Cn sequentially operate in the same manner as the first photoelectric transfer cell C1 with the predetermined period defined by the clock signal CLK.

Further, in the photoelectric transfer device shown in FIG. 21, the switch S6 is operated in the phase reverse to that of the third initializing means S4. Hence, a sample and bold operation is performed in which the input capacitance of the amplifier element QB3 serves as a hold capacitor. The final output signal Vout of the photoelectric transfer device is continuously being output for one clock period.

That is, the circuit configuration shown in FIG. 21, not only the impedance transfer but also the sample and hold operation can be carried out by the first-stage source follower circuit SF1, the second-stage source follower circuit SF2 and the switch S6. Hence, the output signal Vout is continuously being output for one clock period, and the stable time is increased. This contributes to speeding up of the output operation.

Figure 23:
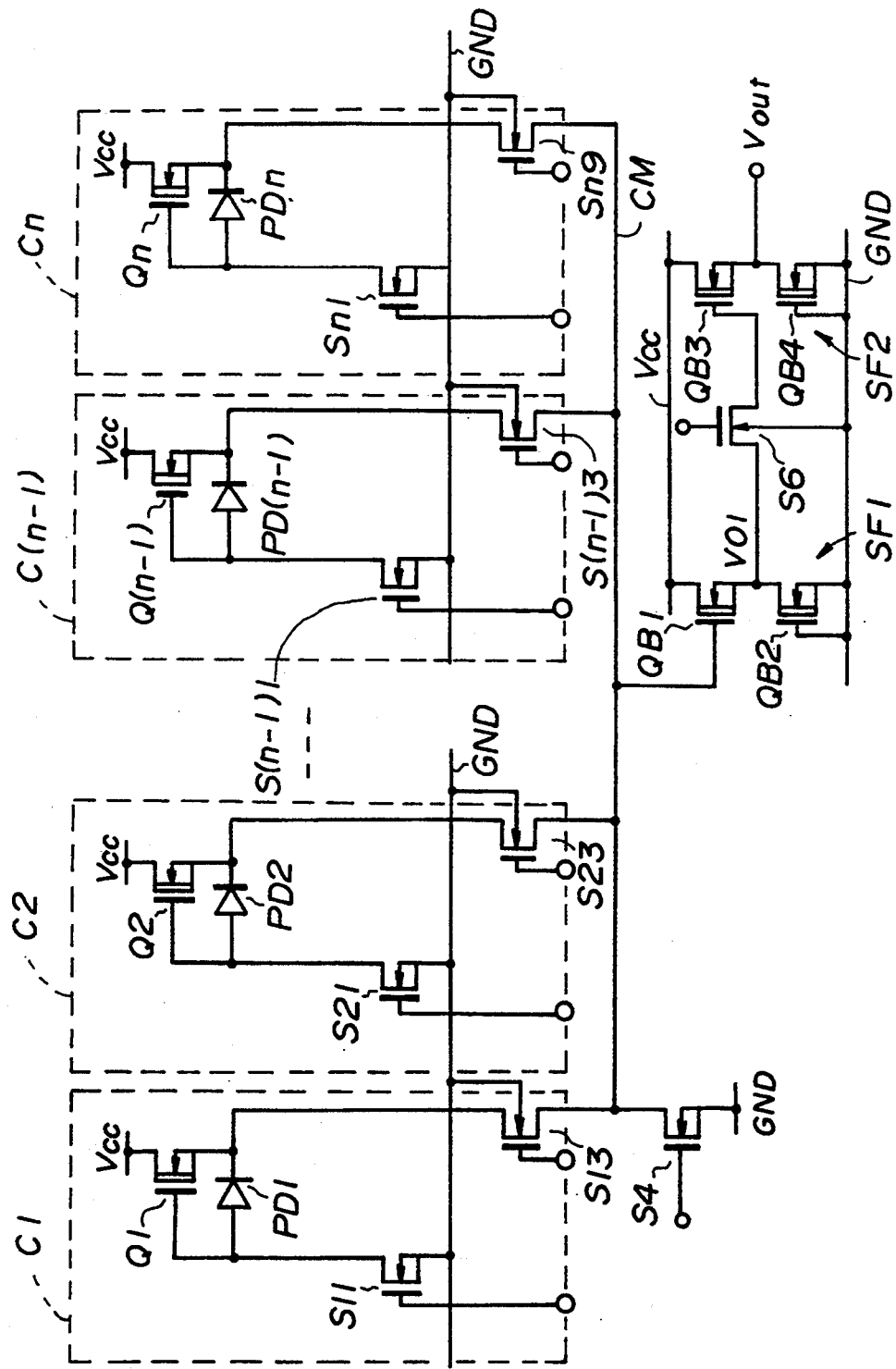
FIG. 23 is a circuit diagram of a concrete example of the photoelectric transfer device shown in FIG. 4.

FIG. 23 is a concrete example of the photoelectric transfer device shown in FIG. 4. The device shown in FIG. 23 includes n photoelectric transfer cells respectively having the same structure. For example, the nth photoelectric transfer cell Cnn is made up of the photoelectric transfer element PDn formed with a photodiode, the amplifier element Qn formed with a depletion-type N-channel MOSFET, the first initializing means Sn1 formed with an N-channel MOSFET, the second initializing means Sn2 formed with an N-channel MOSFET, the read means S13 formed with an N-channel MOSFET, and the third initializing means S4 formed with an N-channel MOSFET. The potentials VR1, VR2 and VR3 used in the initialization are set to 0 V (GND). Further, instead of the amplifier AMP, the circuit shown in FIG. 23 includes the first-stage source follower circuit SF1 composed of the amplifier elements QB1 and QB2, the second stage source follower circuit SF2 composed of the amplifier elements QB3 and QB4, and the switch S6. Furthers, the switch S6 is operated in the phase reverse to that of the third initializing means S4.

Figure 24:
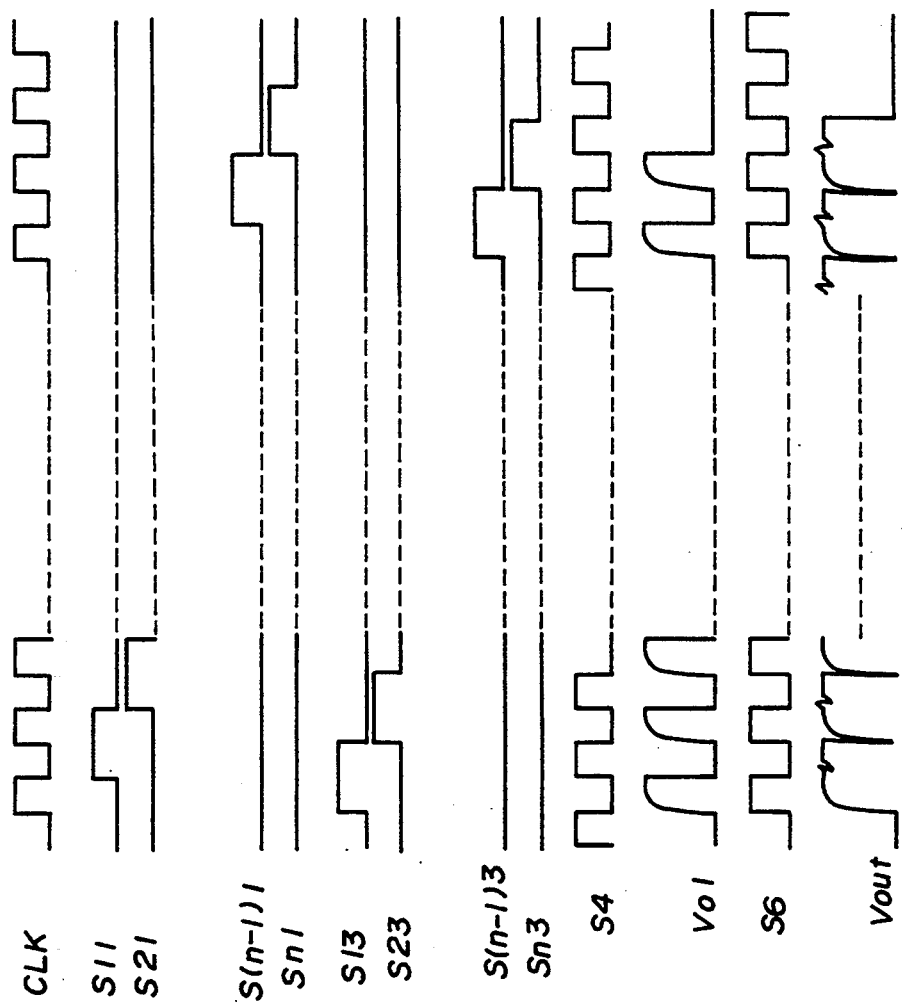
FIG. 24 is a time chart showing the operation of the photoelectric transfer device shown in FIG. 23.

FIG. 24 is a time chart showing the operation of the photoelectric transfer device shown in FIG. 23. The device shown in FIG. 24 operates in synchronism with the aforementioned clock signal CLK having a predetermined period. More particularly, the n photoelectric transfer cells C1–Cn are sequentially initialized one by one every cycle in such a manner that the first cell C1 is initialized within one period of the clock signal CLK and the second cell C2 is initialized within the next period thereof. When the initializing operation on a cell is completed, the photoelectric conversion process of the above cell is initiated. For example, in the photoelectric transfer cell C1 of interest, the switches S13 and S11 are simultaneously turned ON. In this case, the switch S13 is turned ON the half cycle prior to the switch S11. The reading of the output signal of the cell C1 is carried out in the half clock cycle in which only the switch S13 is ON.

In the next half cycle of the clock signal CLK in which the switches S11 and S13 are ON, the switch S4 is turned ON, so that the potential of the common signal line CM and the source potential of the amplifier element Q are set to the ground potential, so that the cell C1 can be initialized.

Next, the switch S13 is turned OFF, and hence the potential of the source of the amplifier element Q1 charges the parasitic capacitance of the source of the switch S13 and the stray capacitance of the source thereof. Then, the source potential of the amplified element Q1 is settled at a potential higher than the gate potential by the gate-source voltage Vth.

Thereafter, the switch S11 is turned OFF. When a photoelectric current based on the quantity of light incident to the photoelectric transfer element PD1 flows therein, the capacity (storage capacity) connected to the gate of the amplifier element Q1 is started to be charged. In this manner, a charge based on the photoelectric current is stored in the capacitor coupled to the gate of the amplifier element Q1, and the gate potential of the amplifier element Q1 is raised. At the same time as the gate potential of the amplifier element Q1 is raised, the source potential is raised by an increase in the gate potential while the parasitic capacitor of the switch S13 and the stray capacitor of the source are charged. In the above manner, the amplifier element Q1 functions as a source follower in which the source voltage is changed so as to follow up the gate voltage. Hence, the gate-source voltage of the amplifier element Q1 is maintained at the constant voltage Vth.

In the circuit configuration shown in FIG. 23, the photoelectric transfer element PD1 is connected between the gate and source of the amplifier element Q1, and thus the gate-source voltage of the amplifier element Q1 functioning as the source follower, that is, the constant Vth is applied to the photoelectric transfer element PD1. Hence, the charge stored in the parasitic capacitor of the photoelectric transfer element PD1 is approximately constant and is little varied. Hence, it becomes possible to greatly reduce the influence of the parasitic capacitance of the photoelectric transfer element PD1 to the storage capacitance. This is equivalent to a situation where the parasitic capacitance of the element PD1 is substantially subtracted from the storage capacitance, and hence the storage capacitance is substantially reduced. The photoelectric transfer device shown in FIG. 23 has sensitivity approximately 10 times that of the conventional photoelectric transfer device.

The photoelectric transfer element C1 is initialized again after a predetermined read time (storage time) elapses. The switch S13 is turned ON in the half period of the clock signal CLK immediately prior to the above initialization, and the source potential obtained immediately prior to the initialization is output, as the output signal, to the common signal line CM. The source potential output to the common signal line CM is applied to the first-stage source follower circuit SF1 made up of the amplifier elements QB1 and QB2. The source follower circuit SF1 functions to transfer the input/output impedance, and outputs a corresponding output signal VO1.

In the next half cycle of the clock signal CLK, the switch S4 is turned ON, so that the potential of the common signal line CM and the source potential of the amplifier element Q are initialized to the ground (GND; 0 V). At the same time, the switch S11 is turned ON, and hence gate potential of the amplifier element Q1 is initialized. The second through nth photoelectric transfer cells C2 through Cn sequentially operate in the same manner as the first photoelectric transfer cell C1 with the predetermined period defined by the clock signal CLK.

Further, in the photoelectric transfer device shown in FIG. 23, the switch S6 is operated in the phase reverse to that of the third initializing means S4. Hence, the sample and hold operation is performed in which the input capacitance of the amplifier element QB3 serves as a hold capacitor. The final output signal Vout of the photoelectric transfer device is continuously being output for one clock period.

That is, for the circuit configuration shown in FIG. 23, not only the impedance transfer but also the sample and hold operation can be carried out by the first-stage source follower circuit SF1, the second-stage source follower circuit SF2 and the switch S6. Hence, the output signal Vout is continuously being output for one clock period, and the stable time is increased. This contributes to speeding up of the output operation.

In the photoelectric transfer device shown in FIG. 23, the second initializing means Sn2 used in the device shown in FIG. 21 is not used, and the function of the second initializing means Sn2 is realized by the operation timings of the first initializing means Sn1 and the third initializing means S4. Hence, the area occupied by the photoelectric transfer cell can be reduced to approximately 85%. This increases the operation speed of the photoelectric transfer device.

In the examples described above, the depletion-type N-channel MOSFET is used to form the amplifier element Q1. It is possible to obtain analogous advantages even when other FETs are used.

Figure 25:
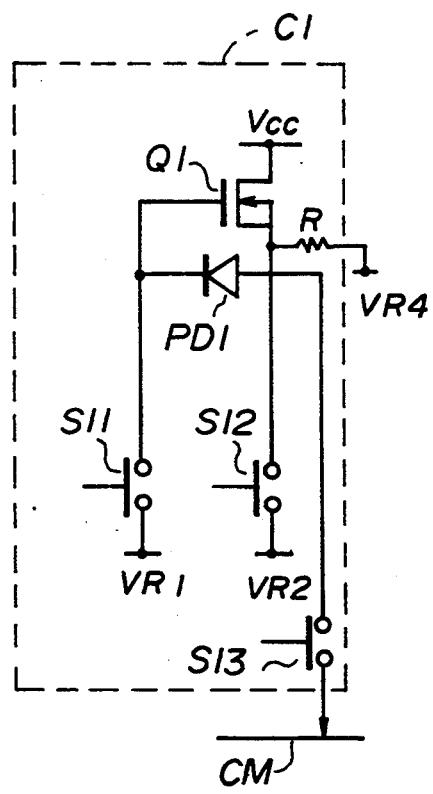
FIG. 25 is a circuit diagram of a variation of the photoelectric transfer cell used in the present invention.
Figure 26:
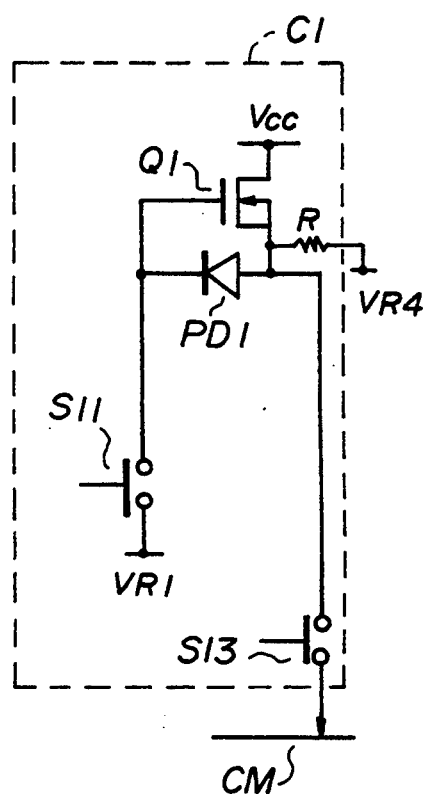
FIG. 26 is a circuit diagram of another variation of the photoelectric transfer cell used in the present invention.

FIGS. 25 and 26 are circuit diagrams of the photoelectric transfer cells C1 in which the amplifier elements Q1 are formed with enhancement-type N-channel MOSFETs. This arrangement differs from that using depletion-type FETs in that the source potential is higher than the gate potential and hence the photoelectric transfer element PD1 has the reverse polarity. Further, in order to correctly operate the amplifier element Q1, a resistor is connected between the source of the amplifier element Q1 and a reference voltage VR4.

FIGS. 27 and 28 are circuit diagrams of the photoelectric transfer cells C1 in which the amplifier elements Q1 are formed with an N-channel JFET (Junction FET). In each of FIGS. 27 and 28, the PN junction between the source and gate of the N-channel JFET is made to serve as the photodiode PD1. Hence, the photodiode PD1 is not needed separately from the MOSFET and the area occupied by the photoelectric transfer cell C1 can be diminished.

It is also possible to use P-channel MOSFETs or JFETs rather than N-channel FETs. In this alternative, the polarities of the potentials to be used and the photoelectric transfer element PD1 are changed. The P-channel FETs provide the same advantages as those of the N-channel FETs.

It is also possible to use an N-type silicon substrate instead of the aforementioned P-type silicon substrate. In the case, the conductivities of the respective elements and parts are reverse to those thereof. For example, the amplifier element Q1 is of the P-channel type. In the above alternative, it is also possible to obtain the same advantages as in the case where the P-type silicon substrate is used.

Figure 29:
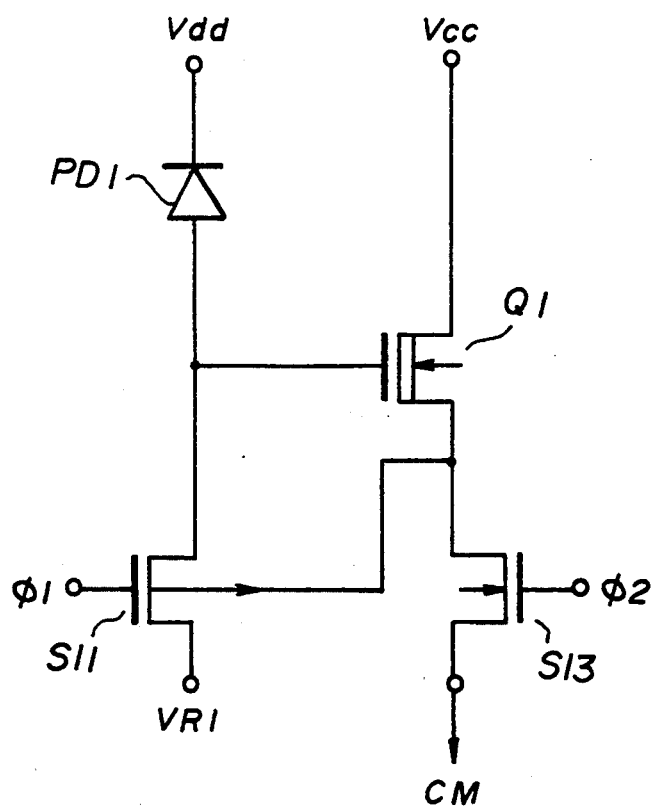
FIG. 29 is a circuit diagram of a still one more variation of the photoelectric transfer cell used in the present invention.

The structures shown in FIGS. 15 through 17 (in which the capacitance connected between the source (or drain) of the first initializing means S11 and the substrate can be reduced) can be applied to an arrangement as shown in FIG. 29 in which one end of the photodiode PD1 serving as the photoelectric transfer element is not connected to the source of the amplifier element Q1, and is particularly effective to a photoelectric transfer stacked layer type device. In this case, it is also possible to connect the back gate of the amplifier element Q1 to the source thereof.

Figure 30:
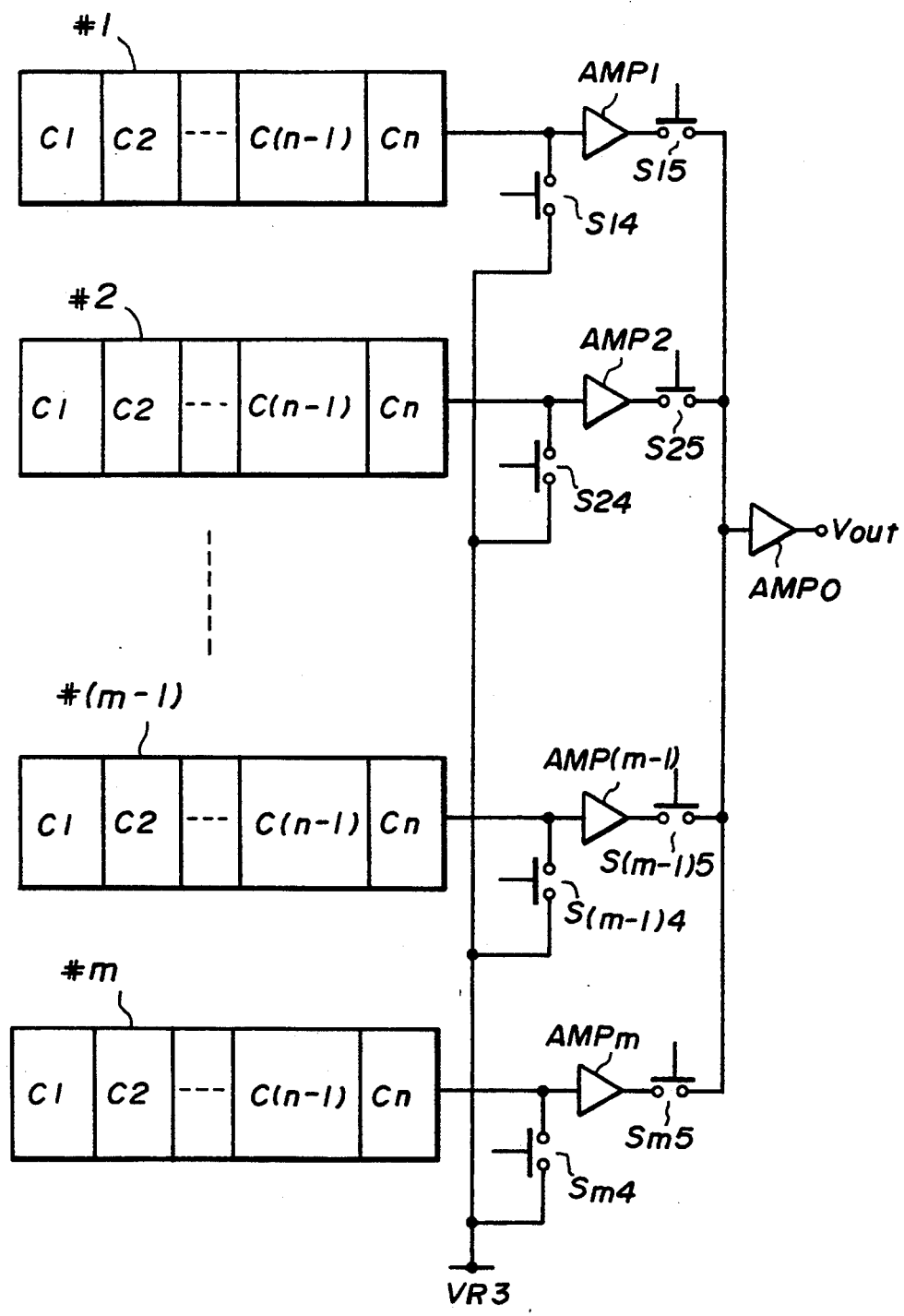
FIG. 30 is a circuit diagram of a photoelectric transfer device according to a third embodiment of the present invention.

FIG. 30 illustrates a photoelectric transfer device according to a third embodiment of the present invention. In the photoelectric transfer device shown in FIG. 30, the structure of the first or second embodiment of the present invention (as shown in FIG. 2 or FIG. 4) is considered as one block, and m blocks #1–#m are connected in parallel. Further, switches S15–Sm5 for block selection are provided. These switches S15–Sm5 are controlled so that one of them is turned ON. Switches S14–Sm4 each correspond to the switch S4 used in the first or second embodiment of the present invention. Amplifiers AMP1 through AMPm may have a driving ability less than that of the amplifier AMP used in the first or second embodiment. The amplifier AMP0 of the final stage needs a driving ability as large as that of the amplifier AMP used in the first or second embodiment.

Figure 31:
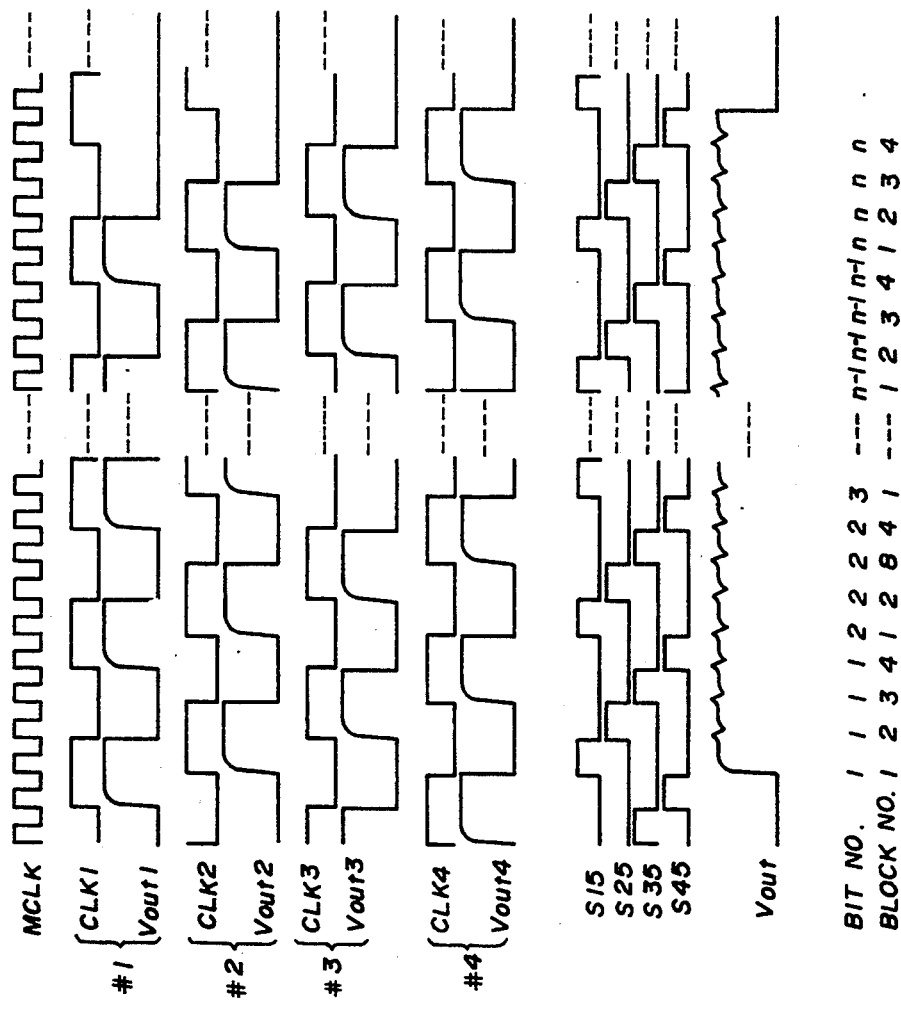
FIG. 31 is a time chart showing the operation of the photoelectric transfer device shown in FIG. 30.

FIG. 31 is a time chart of the photoelectric transfer device shown in FIG. 30 in which four blocks are used. A main clock signal MCLK is the reference timing of the overall photoelectric transfer device. Clock signals CLK1–CLK4 respectively applied to the blocks #1–#4 are obtained by dividing the main clock signal MCLK into four, and the phase differences between these clock signals CLK1–CLK4 are a quarter of a cycle thereof. Similarly, output signals Vout1–Vout4 of the blocks #1–#4 have respective phase differences equal to a quarter of a cycle. When one block is selected for only one cycle of the main clock MCLK immediately prior to the initialization for the above block by means of a corresponding one of the switches S14–S45, the output signal Vout from the amplifier AMP0 is as shown in FIG. 31 in which the signals from the blocks #1–#4 are output one by one every cycle of the main clock signal MCLK1. Further, the bit rate of each block is equal to (1/number of blocks) times the bit rate of the output signal. Hence, the device shown in FIG. 30 can operate at a higher speed.

According to the third embodiment of the present invention, the photoelectric transfer device shown in FIG. 2, FIG. 4, FIG. 21 and FIG. 23 is handled as one block, and a plurality of blocks (m blocks) are connected in parallel. The blocks are made to operate in synchronism with the respective clock signals having the phase differences equal to (1/m) times the predetermined period. With the above structure, it becomes possible to read the output signals from the blocks at high speed.

The present invention is not limited to the specifically disclosed embodiments, and variations and modifications may be made without departing from the scope of the present invention.

What is claimed is:

1. A photoelectric transfer device comprising:
at least one photoelectric transfer cell;
said at least one photoelectric transfer cell comprising:
a photoelectric transfer element comprised of a photodiode generating a photoelectric current based on a quantity of incident light;
an amplifier element including first FET of a normally on type and functioning as a source follower in which a source voltage of the first FET is varied so as to follow a gate voltage thereof and wherein said amplifier element is selected from the group of N channel or P channel and wherein when said amplifier element is a N channel an anode of said photodiode is connected to a gate of said amplifier element and when said amplifier element is a P channel, a cathode of said photodiode is connected to the gate of the amplifier element; and
read means, coupled to said amplifier element, for outputting, as an output signal, the source voltage of the source follower,
said photoelectric transfer element being connected to a gate and source of the amplifier element so that a voltage between the gate and source of the amplifier element is applied across the photoelectric transfer element.

2. The photoelectric transfer device as claimed in claim 1, further comprising first initializing means, connected to the gate of the amplifier element, for initializing the gate voltage of the amplifier element to a predetermined potential after the source voltage is read as the output signal by the read means.

3. The photoelectric transfer device as claimed in claim 1, wherein:
said photoelectric transfer element comprises a photodiode which includes a substrate, a well formed in the substrate, and a region formed in the well;
the substrate and the region have a first conductivity, and the well has a second conductivity;
said amplifier element further comprises a second FET of the second conductivity, and said second FET is formed in the substrate; and
said well having the second conductivity includes as a part thereof the source of said amplifier element.

4. The photoelectric transfer device as claimed in claim 2, wherein:
said photoelectric transfer element comprises a photodiode which includes a substrate, a well formed in the substrate, and a region formed in the well;
the substrate and the region have a first conductivity, and the well has a second conductivity;
said amplifier element further comprises a second FET of the second conductivity, and said second FET is formed in the substrate; and
said well having the second conductivity includes as a part thereof the source of said amplifier element.

5. The photoelectric transfer device as claimed in claim 3, wherein:
said read means comprises a third FET formed in said substrate; and
said well of the second conductivity includes as a part thereof a source or drain of said third FET.

6. The photoelectric transfer device as claimed in claim 4, wherein:
said read means comprises a third FET formed in said substrate; and
said well of the second conductivity includes as a part thereof a source or drain of said third FET.

7. The photoelectric transfer device as claimed in claim 1, further comprising a second FET having a back gate connected to a source of said second FET.

8. The photoelectric transfer device as claimed in claim 2, further comprising a second FET having a back gate connected to a source of said second FET.

9. The photoelectric transfer device as claimed in claim 7, wherein:
said photoelectric transfer element includes a photodiode which includes a substrate, a first well formed in the substrate, and a first region formed in the well;
the substrate and the first region have a first conductivity, and a second well having a second conductivity;
wherein said substrates second well in the substrate, and has a third well formed therein;
said second well has a second conductivity, said third well has the first conductivity; and
said amplifier element is further comprised of a second FET formed in said third well.

10. The photoelectric transfer device claimed in claim 8, wherein:
said photoelectric transfer element includes a photodiode which includes a substrate, a first well formed in the substrate, and a first region formed in the well;
the substrate and the first region have a first conductivity, and a second well having a second conductivity;
wherein said substrates second well has a third well formed therein;
said second well has a second conductivity, and said third well has the first conductivity; and
said amplifier element is comprised of second FET formed in said well.

11. The photoelectric transfer device as claimed in claim 9, wherein said first well and said second well are unified in the substrate.

12. The photoelectric transfer device as claimed in claim 10, wherein said first well and said second well are unified in the substrate.

13. The photoelectric transfer device as claimed in claim 9, wherein said second well provides the source of said amplifier element.

14. The photoelectric transfer device as claimed in claim 10, wherein said second well provides the source of said amplifier element.

15. The photoelectric transfer device as claimed in claim 2, wherein said first initializing means comprises a second FET having a back gate connected to the source of said amplifier element.

16. The photoelectric transfer device as claimed in claim 15, wherein said back gate of said second FET includes a well formed in a substrate, said well corresponding to one pixel.

17. The photoelectric transfer device as claimed in claim 16, wherein said well functioning as the back gate of said second FET provides the source of said amplifier element.

18. The photoelectric transfer device as claimed in claim 16, wherein said well functioning as the back gate of said second FET has a predetermined conductivity.

19. The photoelectric transfer device as claimed in claim 15, wherein the back gate of said second FET and a back gate of said first FET are electrically connected to the source of said amplifier element.

20. The photoelectric transfer device as claimed in claim 19, wherein a back gate of said amplifier element includes a well formed in a substrate, said well corresponding to a single pixel.

21. The photoelectric transfer device as claimed in claim 20, wherein:
said well includes said second FET of said first initializing means, said amplifier element and said photoelectric transfer element; and
a source or drain of said second FET is unified with a conductive region of the photoelectric transfer element.

22. The photoelectric transfer device as claimed in claim 1, further comprising:
a common signal line connected to said photoelectric transfer cell; and
amplifier means, coupled to said common signal line, for amplifying the output signal from said photoelectric transfer cell.

23. The photoelectric transfer device as claimed in claim 22, wherein said amplifier means comprises hold means for holding the output signal for a predetermined period of time.

24. A photoelectric transfer device comprising:
a plurality of photoelectric transfer cells connected in parallel;
each of said photoelectric transfer cells comprising:
a photoelectric transfer element comprised of a photodiode and generating a photoelectric current based on a quantity of incident light;
an amplifier element including first FET of a normally on type and functioning as a source follower in which a source voltage of the first FET is varied so as to follow up a gate voltage thereof and wherein said amplifier element is selected from the group of N channel or P channel and wherein when said amplifier element is a N channel an anode of said photodiode is connected to a gate of said amplifier element and when said amplifier element is a P channel, a cathode of said photodiode is connected to the gate of the amplifier element; and
read means, coupled to said amplifier element, for outputting, as an output signal, the source voltage of the source follower,
said photoelectric transfer element being connected to a gate and source of the amplifier element so that a voltage between the gate and source of the amplifier element is applied across the photoelectric transfer element.

25. The photoelectric transfer device as claimed in claim 24, wherein said plurality of photoelectric transfer cells operate at different timings defined by a clock signal applied to the plurality of photoelectric transfer cells.

26. A photoelectric transfer device comprising:
at least one photoelectric transfer cell;
said at least one photoelectric transfer cell comprising
a photoelectric transfer element comprised of a photodiode generating a photoelectric current based on a quantity of incident light;

an amplifier element including a first FET of a normally-off type and functioning as a source follower in which a source voltage of said first FET is varied so as to follow a gate voltage thereof and wherein said amplifier element is selected from the group of N channel or P channel and when said amplifier element is a N channel an anode of said photodiode is connected to the gate of said amplifier element in which said amplifier element is a P channel a cathode of said photodiode is connected to the gate of the amplifier element;

read means coupled to said amplifier element for outputting, as an output signal, a source voltage of the source follower;

said photoelectric transfer element being connected to the gate and source of the amplifier element so that a voltage between the gate and source of the amplifier element is applied across the photoelectric transfer element; and a means for supplying a reference voltage to the source of the amplifier element via a resistor.

27. The photoelectric transfer device as claimed in claim 26, further comprising first initializing means, connected to the gate of the amplifier element, for initializing the gate voltage of the amplifier element to a predetermined potential after the source voltage is read as the output signal by the read means.

28. The photoelectric transfer device as claimed in claim 26, wherein:
said photoelectric transfer element comprises a photodiode which includes a substrate, a well formed in the substrate, and a region formed in the well;
the substrate and the region have a first conductivity, and the well has a second conductivity;
said amplifier element further comprises a second FET of the second conductivity, and said second FET is formed in the substrate; and
said well having the second conductivity includes as a part thereof the source of said amplifier element.

29. The photoelectric transfer device as claimed in claim 27, wherein:
said photoelectric transfer element comprises a photodiode which includes a substrate, a well formed in the substrate, and a region formed in the well;
the substrate and the region have a first conductivity, and the well has a second conductivity;
said amplifier element further comprises a second FET of the second conductivity, and said second FET is formed in the substrate; and
said well having the second conductivity includes as a part thereof the source of said amplifier element.

30. The photoelectric transfer device as claimed in claim 28, wherein:
said read means comprises a third FET formed in said substrate; and
said well of the second conductivity includes as a part thereof a source or drain of said third FET.

31. The photoelectric transfer device as claimed in claim 29, wherein:
said read means comprises a third FET formed in said substrate; and
said well of the second conductivity includes as a part thereof a source or drain of said third FET.

32. The photoelectric transfer device as claimed in claim 26, further comprising:
a second FET having a back gate connected to a source of said second FET.

33. The photoelectric transfer device as claimed in claim 27, further comprising:
a second FET having a back gate connected to a source of said second FET.

34. The photoelectric transfer device as claimed in claim 32, wherein:
said photoelectric transfer element includes a photodiode which includes a substrate, a first well formed in the substrate, and a first region formed in the well;
the substrate and the first region have a first conductivity, and a second well having a second conductivity;
wherein said substrates second well in the substrate, has a third well therein;
said second well has a second conductivity, and said third well has the first conductivity; and
said amplifier element is further comprised of a second FET formed in said third well.

35. The photoelectric transfer device as claimed in claim 33, wherein:
said photoelectric transfer element includes a photodiode which includes a substrate, a first well formed in the substrate, and a first region formed in the well;
the substrate and the first region have a first conductivity, and a second well having a second conductivity;
wherein said substrates second well has a third well formed therein;
said second well has a second conductivity, and said third well has the first conductivity; and
said amplifier element is comprised of a second FET formed in said third well.

36. The photoelectric transfer device as claimed in claim 34, wherein said first well and said second well are unified in the substrate.

37. The photoelectric transfer device as claimed in claim 35, wherein said first well and said second well are unified in the substrate.

38. The photoelectric transfer device as claimed in claim 34, wherein said second well provides the source of said amplifier element.

39. The photoelectric transfer device as claimed in claim 35, wherein said second well provides the source of said amplifier element.

40. The photoelectric transfer device as claimed in claim 27, wherein said first initializing means comprises a second FET having a back gate connected to the source of said amplifier element.

41. The photoelectric transfer device as claimed in claim 40, wherein said back gate of said second FET includes a well formed in a substrate, said well corresponding to one pixel.

42. The photoelectric transfer device as claimed in claim 41, wherein said well functioning as the back gate of said second FET provides the source of said amplifier element.

43. The photoelectric transfer device as claimed in claim 41, wherein said well functioning as the back gate of said second FET has a predetermined conductivity.

44. The photoelectric transfer device as claimed in claim 40, wherein the back gate of said second FET and a back gate of said first FET are electrically connected to the source of said amplifier element.

45. The photoelectric transfer device as claimed in claim 44, wherein a back gate of said amplifier element includes a well formed in a substrate, said well corresponding to a single pixel.

46. The photoelectric transfer device as claimed in claim 45, wherein:
said well includes said second FET of said first initializing means, said amplifier element and said photoelectric transfer element; and
a source or drain of said second FET is unified with a conductive region of the photoelectric transfer element.

47. The photoelectric transfer device as claimed in claim 26, further comprising:
a common signal line connected to said photoelectric transfer cell; and
amplifier means, coupled to said common signal line, for amplifying the output signal from said photoelectric transfer cell.

48. The photoelectric transfer device as claimed in claim 47, wherein said amplifier means comprises hold means for holding the output signal for a predetermined period of time.

* * * * *